US011437427B2

(12) United States Patent
Chiu et al.

(10) Patent No.: US 11,437,427 B2
(45) Date of Patent: Sep. 6, 2022

(54) LIGHT-EMITTING DEVICE AND MANUFACTURING METHOD THEREOF

(71) Applicant: EPISTAR CORPORATION, Hsinchu (TW)

(72) Inventors: Po-Shun Chiu, Hsinchu (TW); Tsung-Hsun Chiang, Hsinchu (TW); Liang-Sheng Chi, Hsinchu (TW); Jing Jiang, Hsinchu (TW); Jie Chen, Hsinchu (TW); Tzung-Shiun Yeh, Hsinchu (TW); Hsin-Ying Wang, Hsinchu (TW); Hui-Chun Yeh, Hsinchu (TW); Chien-Fu Shen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 199 days.

(21) Appl. No.: 16/750,227

(22) Filed: Jan. 23, 2020

(65) Prior Publication Data
US 2020/0243598 A1 Jul. 30, 2020

(30) Foreign Application Priority Data
Jan. 24, 2019 (CN) .......................... 201910068664.4

(51) Int. Cl.
| H01L 27/15 | (2006.01) |
| H01L 33/36 | (2010.01) |
| F21K 9/00 | (2016.01) |
| H01L 33/62 | (2010.01) |

(52) U.S. Cl.
CPC .............. *H01L 27/153* (2013.01); *F21K 9/00* (2013.01); *H01L 33/36* (2013.01); *H01L 33/62* (2013.01)

(58) Field of Classification Search
CPC ......... F21K 9/00; H01L 27/153; H01L 33/36; H01L 33/62
See application file for complete search history.

(56) References Cited

U.S. PATENT DOCUMENTS

| 2014/0110744 A1* | 4/2014 | Wang | H01L 33/0095 257/99 |
| 2016/0343910 A1* | 11/2016 | Huang | H01L 27/15 |
| 2017/0108173 A1* | 4/2017 | Kim | G06F 1/1662 |

* cited by examiner

*Primary Examiner* — Latanya N Crawford Eason
(74) *Attorney, Agent, or Firm* — Patterson + Sheridan, LLP

(57) ABSTRACT

A light-emitting device, includes a substrate, including an upper surface; a first light emitting unit and a second light emitting unit, formed on the upper surface, wherein each of the first light emitting unit and the second light emitting unit includes a lower semiconductor portion and an upper semiconductor portion; and a conductive structure electrically connecting the first light emitting unit and the second light emitting unit; wherein the lower semiconductor portion of the first light emitting unit includes a first sidewall and a first upper surface; and wherein the first side wall includes a first sub-side wall and a second sub-side wall, an obtuse angle is formed between the first sub-side wall and the first upper surface and another obtuse angle is formed between the second sub-side wall and the upper surface.

20 Claims, 18 Drawing Sheets

A-A'

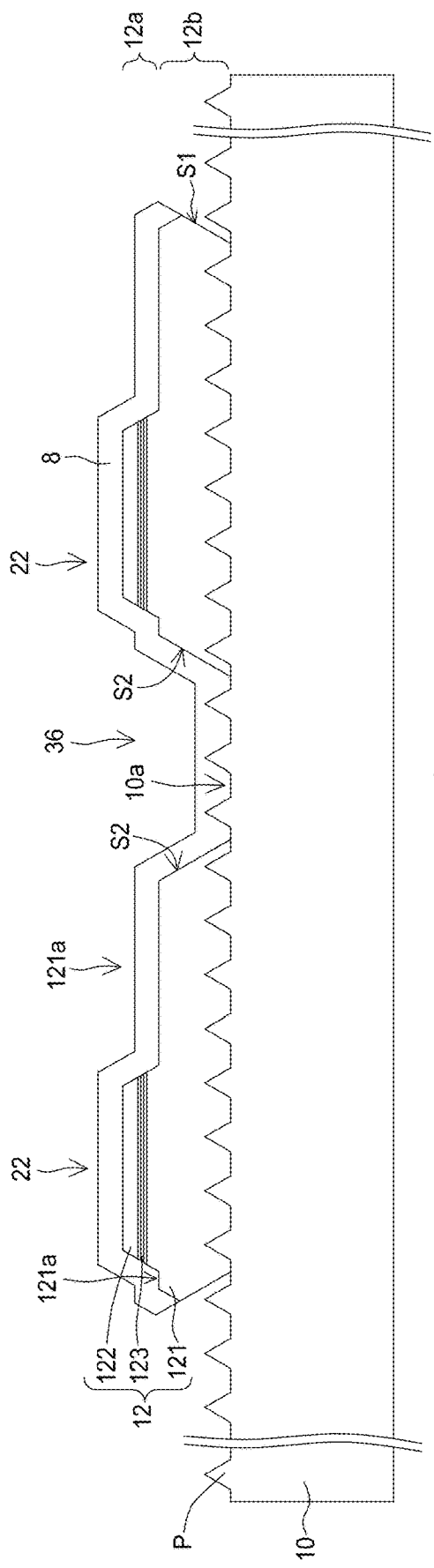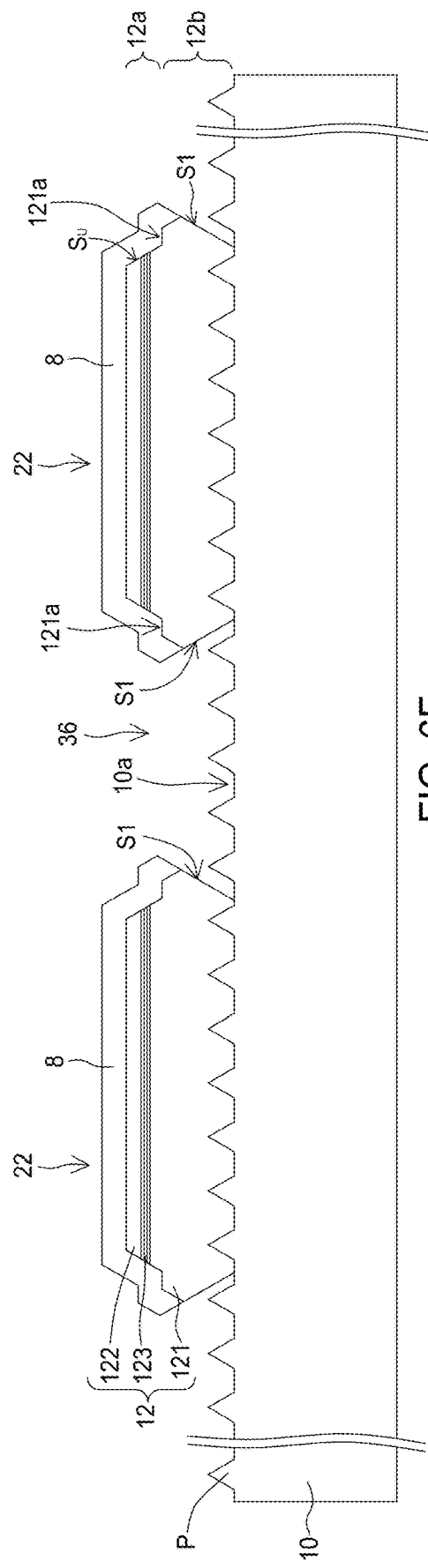
FIG. 6E
FIG. 6F

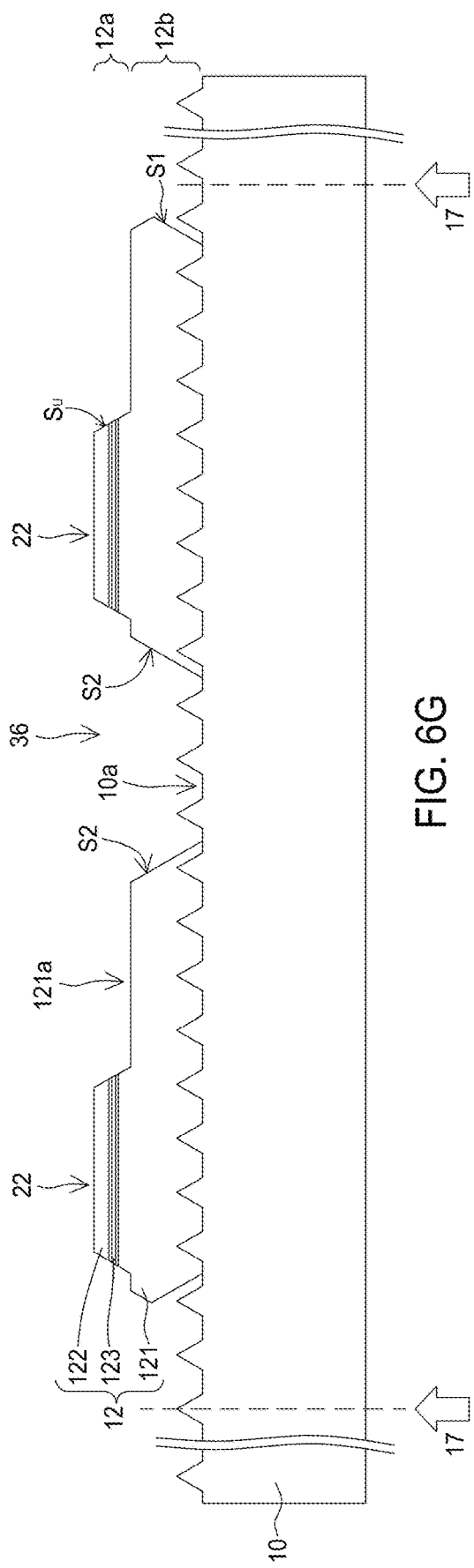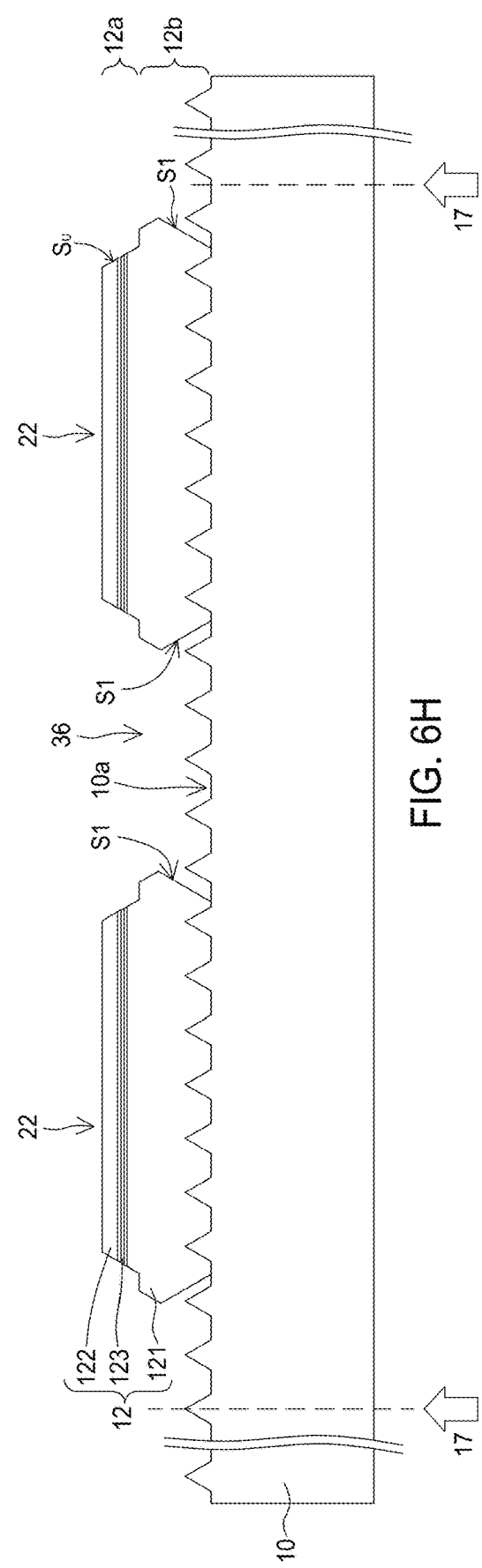

LIGHT-EMITTING DEVICE AND MANUFACTURING METHOD THEREOF

CROSS-REFERENCE TO RELATED APPLICATIONS

This application claims priority to the benefit of China Patent Application Number 201910068664.4 filed on Jan. 24, 2019, and the entire contents of which are hereby incorporated by reference herein in its entirety.

BACKGROUND

Technical Field

The present disclosure relates to a light-emitting device, more specifically, to a light-emitting device with an improved light-emitting efficiency.

Description of the Related Art

The light-emitting diodes (LEDs) of solid-state lighting device have the characteristics of low power consumption, low heat-generation, long lifetime, compact size, and high response speed. Thus, the LEDs have been widely using in household appliance, lighting devices, indicating lamps, optical devices and the like. As the optical technique develops, solid-state lighting devices have great improvements in light-emitting efficiency, lifetime, and brightness.

A conventional LED chip includes a substrate, an n-type semiconductor layer, an active region, a p-type semiconductor layer formed on the substrate, and p-electrode and n-electrode respectively formed on the p-type and n-type semiconductor layers. By applying a specific forward voltage on the LED chip via the electrodes, holes from the p-type semiconductor layer and electrons from the n-type semiconductor layer are combined in the active region so as to emit light.

A high-voltage LED chip is a single chip which is divided into a plurality of light-emitting units electrically connected in series. Compared with the conventional LED chip, the high-voltage LED chip can be operated at low current and high voltage and has a large output power at the same chip size.

The number and the size of the light-emitting units of the high-voltage LED chip can be determined in accordance with an input voltage, and each light-emitting unit can be optimized. The high-voltage LED chip has advantages of high voltage operation, small size, and flexibility of package design and optical design. However, in conventional art, the light emitted from the plurality of light-emitting units on the single substrate may be absorbed by the adjacent light-emitting units or the layers between them, resulting in poor light-emitting efficiency.

SUMMARY OF THE DISCLOSURE

A light-emitting device, includes a substrate, including an upper surface; a first light emitting unit and a second light emitting unit, formed on the upper surface, wherein each of the first light emitting unit and the second light emitting unit includes a lower semiconductor portion and an upper semiconductor portion; and a conductive structure electrically connecting the first light emitting unit and the second light emitting unit; wherein the lower semiconductor portion of the first light emitting unit includes a first sidewall and a first upper surface; and wherein the first side wall includes a first sub-side wall and a second sub-side wall, an obtuse angle is formed between the first sub-side wall and the first upper surface and another obtuse angle is formed between the second sub-side wall and the upper surface.

A light-emitting device, includes a substrate, including an upper surface; a first light emitting unit and a second light emitting unit, formed on the upper surface, wherein each of the first light emitting unit and the second light emitting unit includes a lower semiconductor portion and an upper semiconductor portion; and a conductive structure, electrically connecting the first light emitting unit and the second light emitting unit; wherein the lower semiconductor portion of the first light emitting unit includes a first side wall, adjacent to a periphery of the light-emitting device; wherein an included angle between the first side wall and the upper surface is an obtuse angle; and wherein in a side view, the first side wall has a parallelogram-like shape or a parallelogram shape with a pair of diagonal angles having a first acute angle and a second acute angle.

BRIEF DESCRIPTION OF THE DRAWINGS

FIGS. 6A to 6H show a manufacturing method of a light-emitting device 1 in accordance with an embodiment of the present application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
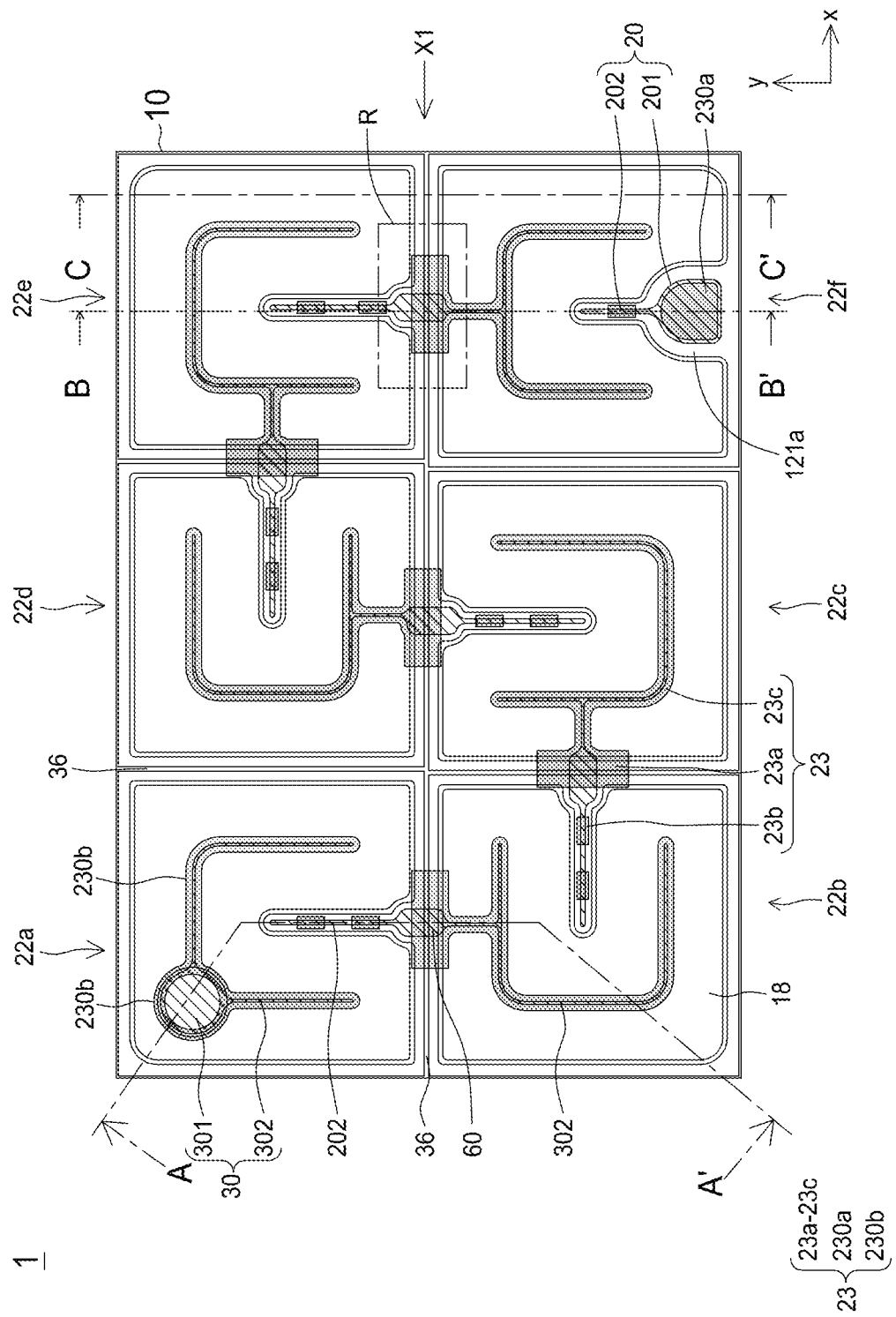
FIG. 1 shows a top view of a light-emitting device 1 in accordance with an embodiment of the present application.
Figure 2A:
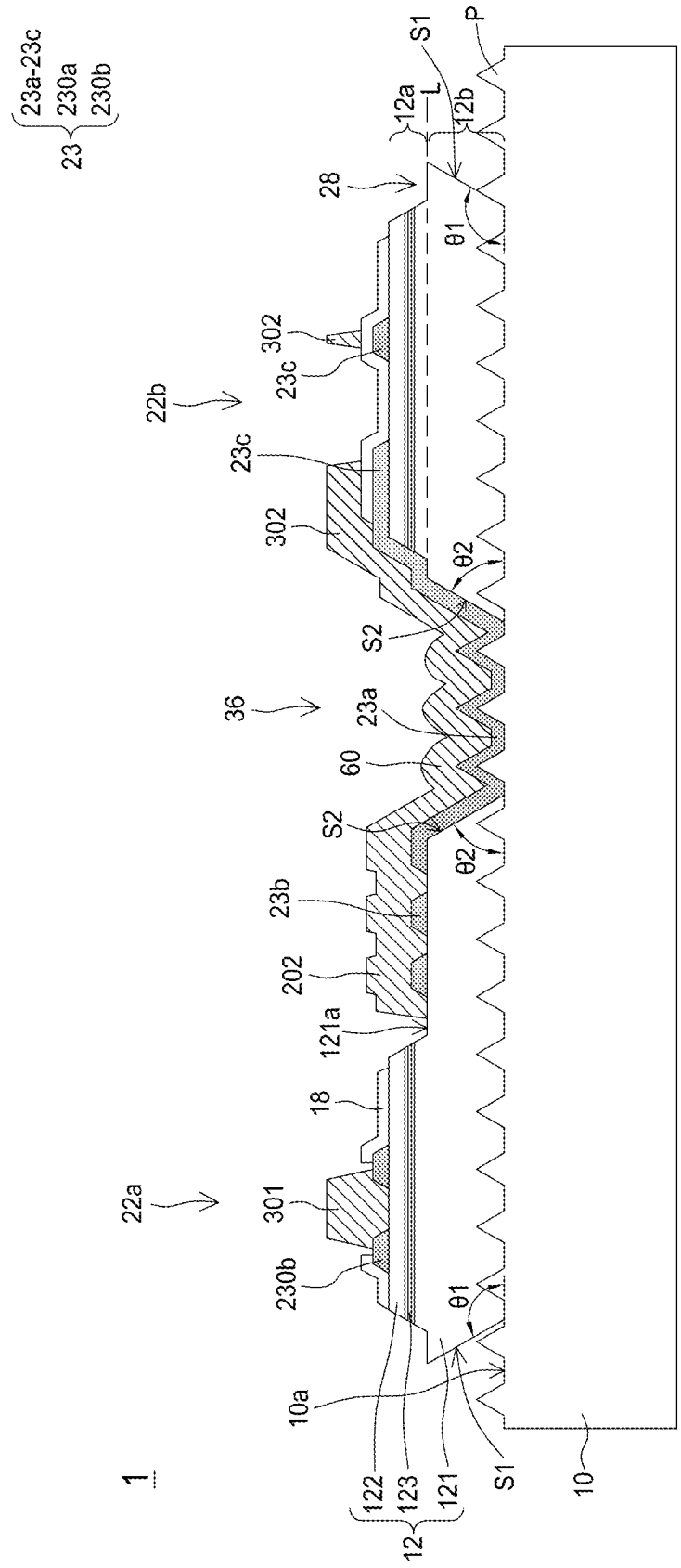
FIGS. 2A to 2C show cross-sectional views of the light-emitting device 1.
Figure 2B:
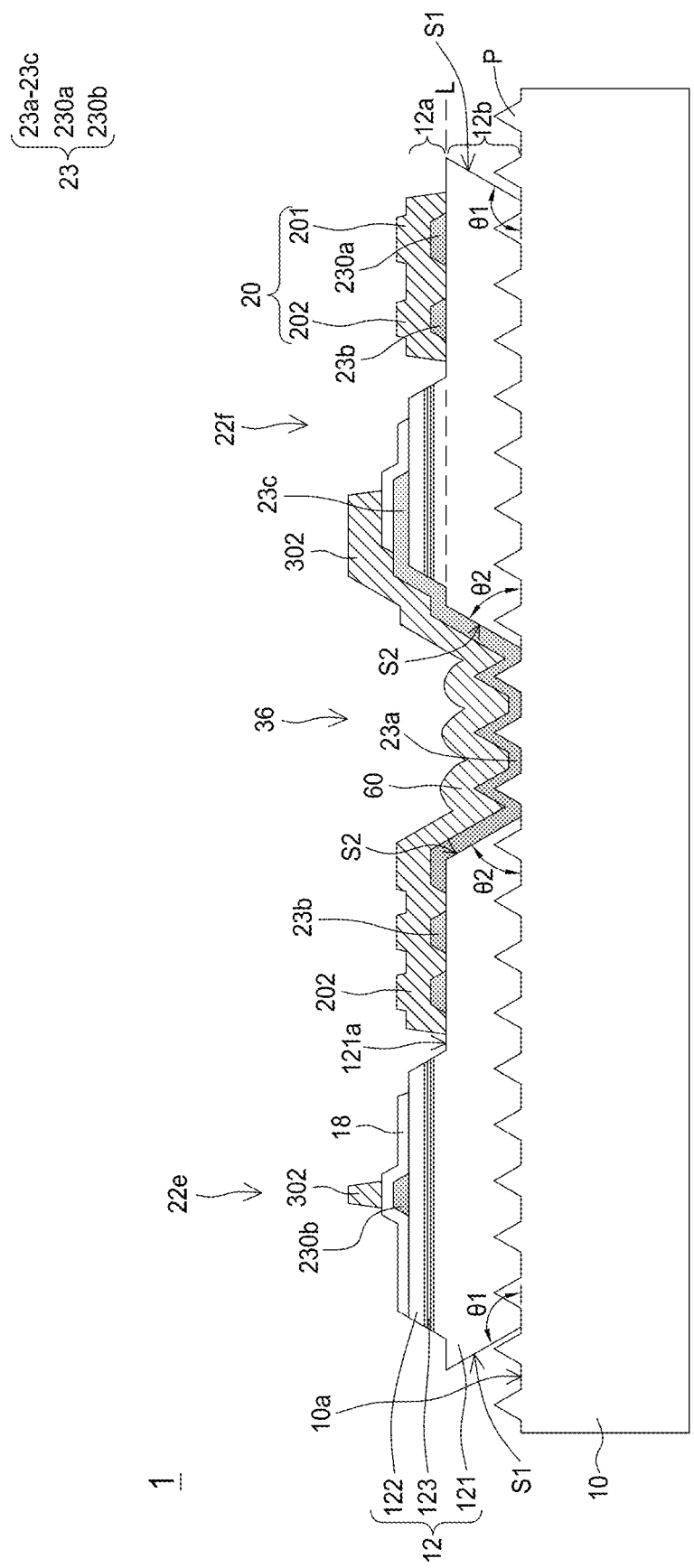
Figure 2C:
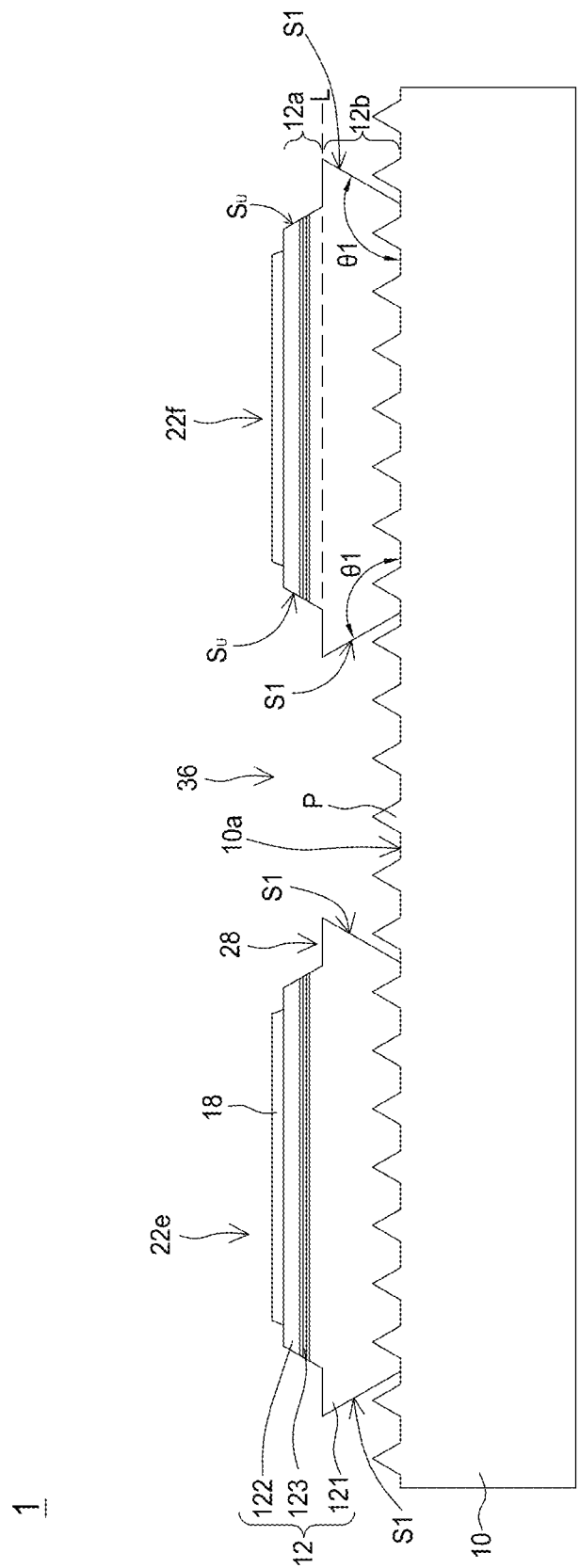
Figure 2D:
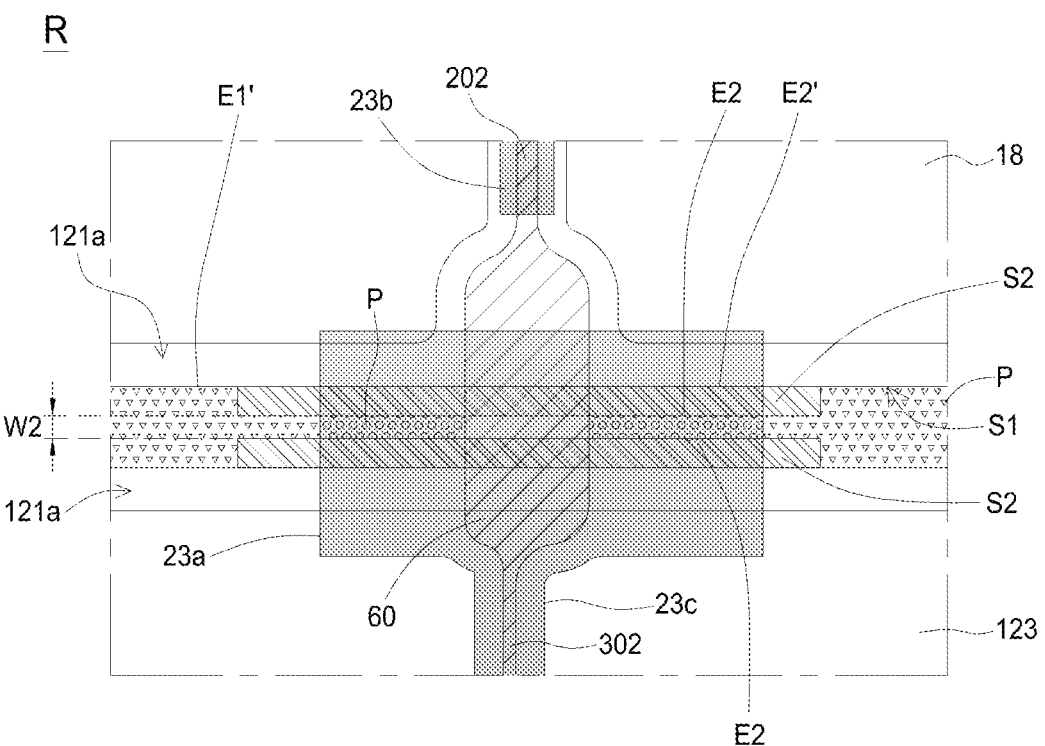
FIG. 2D shows an enlarged top view of the light-emitting device 1.

FIG. 1 shows a light-emitting device 1 in accordance with a first embodiment of the present application. FIGS. 2A, 2B, and 2C show cross-sectional views taken along the A-A' line, the B-B' line and the C-C' line in FIG. 1, respectively. FIG. 2D shows a partial enlarged view of a region R in FIG. 1.

The light-emitting device 1 includes a substrate 10, and a plurality of light-emitting units 22 (22a-22f) separately formed on an upper surface 10a of the substrate 10 and separated from each other by trenches 36. Each light-emitting unit 22 includes a semiconductor stack 12. Conductive structures are formed between adjacent light-emitting units 22 and on each light-emitting unit 22 so as to electrically connect the light-emitting units 22 to form light-emitting unit array.

The substrate 10 can be a growth substrate for growing AlGaInP semiconductor thereon, such as GaAs substrate or GaP substrate. The substrate 10 can be a growth substrate for growing InGaN or AlGaN thereon, such as sapphire substrate, GaN substrate, SiC substrate, or MN substrate. The substrate 10 includes the upper surface 10a that is parallel to the xy-plane shown in FIG. 1. The substrate 10 can be a patterned substrate, that is, the substrate 10 has a plurality of patterned structures P on the upper surface 10a. In one embodiment, the plurality of patterned structures P is formed by mechanical grinding or etching such as dry etching or wet etching that partially etches the upper surface of the substrate 10. In another embodiment, the plurality of patterned structures P is formed by patterning a layer that has material different from that of the substrate 10 on the upper surface 10a. The patterned structure P includes a polygonal structure, such as a mesa with a triangular (or polygonal) bottom surface, or a pyramid with a triangular (or polygonal) bottom surface, a hemisphere, or a cone. Light emitted from the semiconductor stack 12 can be refracted by the plurality of patterned structures P, thereby increasing the brightness of the light-emitting device. In addition, the plurality of patterned structures P lessens or inhibits the dislocation due to lattice mismatch between the substrate 10 and the semiconductor stack 12, thereby improving the epitaxial quality of the semiconductor stack 12. In another embodiment, the patterned structure P is a recess (not shown) extending from the upper surface 10a of the substrate 10 into the substrate 10a. The shape of the recess can be pyramidal, hemispherical, conical or polygonal.

In an embodiment of the present application, the semiconductor stack 12 is formed on the substrate 10 by epitaxy such as metal-organic chemical vapor deposition (MOCVD), molecular beam epitaxy (MBE), hydride vapor epitaxy (HVPE), or physical vapor deposition such as sputtering or evaporating.

The semiconductor stack 12 includes a buffer structure (not shown), a first semiconductor layer 121, an active region 123, and a second semiconductor layer 122 sequentially formed on the substrate 10. The buffer structure can reduce the lattice mismatch and suppress dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In one embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment, the first semiconductor layer 121 and the second semiconductor layer 122 are, for example, a cladding layer or a confinement layer. The first semiconductor layer 121 and the second semiconductor layer 122 have different conductivity types, different electrical properties, different polarities, or different dopants for providing electrons or holes. For example, the first semiconductor layer 121 is an n-type semiconductor and the second semiconductor layer 122 is a p-type semiconductor. The active region 123 is formed between the first semiconductor layer 121 and the second semiconductor layer 122. Driven by a current, electrons and holes are combined in the active region 123 to convert electrical energy into optical energy for illumination. The wavelength of the light emitted by the light-emitting device 1 or the semiconductor stack 12 can be adjusted by changing the physical properties and chemical composition of one or more layers in the semiconductor stack 12.

The material of the semiconductor stack 12 includes III-V semiconductor like $Al_xIn_yGa_{(1-x-y)}N$ or $Al_xIn_yGa_{(1-x-y)}P$, where $0 \leq x$, $y \leq 1$; $x+y \leq 1$. When the material of the active region of the semiconductor stack 12 includes AlInGaP, it emits red light having a wavelength between 610 nm and 650 nm or yellow light having a wavelength between 550 nm and 570 nm. When the material of the active region of the semiconductor stack 12 includes InGaN, it emits blue light or deep blue light having a wavelength between 400 nm and 490 nm or green light having a wavelength between 490 nm and 550 nm. When the material of the active region of the semiconductor stack 12 includes AlGaN, it emits UV light having a wavelength between 250 nm and 400 nm. The active region 123 can be a single hetero-structure (SH), a double hetero-structure (DH), a double-side double hetero-structure (DDH), or a multi-quantum well (MQW). The material of the active region 123 can be i-type, p-type, or n-type.

The semiconductor stack 12 of each light-emitting unit 22 includes a platform 28. The platform 28 is formed by removing portions of the second semiconductor layer 122 and the active region 123 from the upper surface of the semiconductor stack 12 to expose the upper surface 121a of the first semiconductor layer 121. In a subsequent process, the conductive structure is formed on the platform 28. The portion of the semiconductor stack 12 above the extending line L (and the extending surface) of the platform 28 is defined as an upper semiconductor portion 12a, and the portion of the semiconductor stack 12 below the extending line L is defined as a lower semiconductor portion 12b. The upper semiconductor portion 12a includes the second semiconductor layer 122 and the active region 123. In an embodiment, the upper semiconductor portion 12a further includes a portion of the first semiconductor layer 121. The lower semiconductor portion 12b includes the buffer structure and the other portion of the first semiconductor layer 121 or the entire first semiconductor layer 121. In an embodiment, a portion of the platform 28 of each light-emitting unit 22 surrounds the second semiconductor layer 122 and the active region 123.

A trench 36 is located between any two adjacent light-emitting units 22, the bottom portion of which is the upper surface 10a of the substrate 10, and the side walls of which are the side walls of the semiconductor stacks 12 of two adjacent light-emitting units 22. In one embodiment, the substrate 10 is a patterned substrate and the plurality of patterned structures P is located at the bottom of the trench 36. In one embodiment, the substrate 10 is a patterned substrate and the plurality of patterned structures P surrounds all of the light-emitting units 22.

An insulator 23 is disposed on each of the light-emitting units 22 and in the trenches 36. The insulator 23 covers the upper surface 10a of the substrate 10 and the patterned structures P, and extends to the side walls and upper surface of the semiconductor stack 12 of the light-emitting unit 22. In the present embodiment, the insulator 23 includes: a first insulating portion 230a on the platform 28 of the end light-emitting unit 22f in the light-emitting unit array, a second insulating portion 230b on the second semiconductor layer 122 of the starting light-emitting unit 22a in the light-emitting unit array, middle portions 23a on the trenches 36, island portions 23b, and extending portions 23c. In the embodiment shown in FIG. 2A, the middle portion 23a covers the side wall S2 of the lower semiconductor portion 12b of the light-emitting unit 22a, the upper surface 10a of the substrate 10, and the side wall S2 of the semiconductor stack 12 of the light-emitting unit 22b. In another embodiment, the middle portion 23a covers a portion of the trench 36, but does not cover the side wall S2 of the lower semiconductor portion 12b of the light-emitting unit 22a or only covers a portion of the side wall S2 of the lower semiconductor portion 12b of the light-emitting unit 22a. The island portion 23b is formed on the upper surface 121a (i.e. the platform 28) of the light-emitting unit 22a and the extending portion 23c is formed on the upper surface of the second semiconductor layer 122 of the light-emitting unit 22b. As shown in FIG. 1, the island portion 23b includes one island or a plurality of islands. The extending portion 23c extends from the middle portion 23a. In another embodiment, the insulator 23 does not include the island portion 23b. In another embodiment, the insulator 23 does not include the extending portion 23c. In another embodiment, the first insulating portion 230a can be omitted.

The material of the insulator 23 includes transparent insulating material such as silicon oxide, silicon nitride, silicon oxynitride, titanium oxide, aluminum oxide, a combination thereof or a stack laminated by any of the above materials. The insulator 23 can be a single layer or a stack formed by multiple insulator pairs, and each insulator pair comprises two sub-layers with different insulating materials. The insulator 23 can be a distributed Bragg reflector (DBR).

In one embodiment, the first insulating portion 230a, the second insulating portion 230b, the middle portion 23a, the island portion 23b, and the extending portion 23c are formed in the same process. For example, a transparent insulating material is formed on the upper surface of the light-emitting device 1, and then is patterned by photolithography to form the first insulating portion 230a, the second insulating portion 230b, the middle portion 23a, the island portion 23b, and the extending portion 23c. In one embodiment, the first insulating portion 230a, the second insulating portion 230b, the middle portion 23a, the island portion 23b, and the extending portion 23c have the same material and/or substantially the same thickness. In another embodiment, the first insulating portion 230a, the second insulating portion 230b, the middle portion 23a, the island portion 23b, and the extending portion 23c are formed in different processes. For example, the first insulating portion 230a and the second insulating portion 230b are formed in the same process, and the middle portion 23a, the island portion 23b, and the extending portion 23c are formed in another process. In one embodiment, the first insulating portion 230a, the second insulating portion 230b, the middle portion 23a, the island portion 23b, and the extending portion 23c have different materials, for example, the first insulating portion 230a and the second insulating portion 230b have the same material, and the middle portion 23a, the island portion 23b, and the extension portion 23c have another identical material. In one embodiment, the first insulating portion 230a, the second insulating portion 230b, the middle portion 23a, the island portion 23b and the extending portion 23c have different laminated structures; for example, the first insulating portion 230a and the second insulating portion 230b are stacks of multiple layers. The middle portion 23a, the island portion 23b and the extending portion 23c have single layer structure.

In one embodiment, the second insulating portion 230b includes an opening exposing the upper surface of the second semiconductor layer 122 of the light-emitting unit 22a. In another embodiment, the second insulating portion 230b includes a plurality of separate islands (not shown) on the second semiconductor layer 122 of the light-emitting unit 22a. The upper surface of the second semiconductor layer 122 of the light-emitting unit 22a is exposed between the separated islands.

A transparent conductive layer 18 covers the upper surface of the second semiconductor layer 122 of each of the light-emitting units 22 and is electrically contact the second semiconductor layer 122. In this embodiment, the transparent conductive layer 18 also covers the extending portion 23c and the second insulating portion 230b of the insulator 23. The transparent conductive layer 18 can be metal or a transparent conductive material. The metal can be a thin metal layer having light transmissivity. The transparent conductive material is transparent to the light emitted from the active region 123, and includes indium tin oxide (ITO), aluminum zinc oxide (AZO), gallium zinc oxide (GZO), or indium zinc oxide (IZO). In one embodiment, the transparent conductive layer 18 also has an opening corresponding to the opening of the second insulating portion 230b.

The conductive structure is formed on the light-emitting units 22 and the trenches 36. The conductive structure includes a first electrode 20 and a second electrode 30 on the light-emitting unit 22, and connection electrodes 60 between two adjacent light-emitting units 22 (e.g. 22a and 22b, 22b and 22c, 22c and 22d, 22d and 22e, 22e and 22f). The material of the conductive structure comprises metal, such as chromium (Cr), titanium (Ti), gold (Au), aluminum (Al), copper (Cu), tin (Sn), nickel (Ni), rhodium (Rh), platinum (Pt), an alloy thereof or a stack laminated by any of the above materials.

Referring to FIGS. 1 and 2B, the first electrodes 20 is formed on the first semiconductor layer 121 of the light-emitting unit 22f and includes a first pad electrode 201 and a first extending electrode 202 extending from the first pad electrode 201. The first electrode 20 is electrically connected to the first semiconductor layer 121 and located above the first insulating portion 230a. The other first extending electrodes 202 electrically connect to the first semiconductor layer 121 of each of the other light-emitting units. The second electrode 30 is formed on the transparent conductive layer 18 the light-emitting unit 22a and electrically connects to the transparent conductive layer 18 and the second semiconductor layer 122. The second electrode 30 includes a second pad electrode 301 and a second extending electrode 302 extending from the second pad electrode 301. The other second extending electrodes 302 electrically connect to the second semiconductor layer 122 of each of the other light-emitting units. In this embodiment, the position of the second pad electrode 301 corresponds to the opening of the second insulating portion 230b and the opening of the transparent conductive layer 18 so that the second pad electrode 301 contacts the second semiconductor layer 122 via these openings. The connection electrode 60 is formed on the middle portion 23a of the insulator 23, and connects the first extending electrode 202 on one of the light-emitting units and the second extending electrode 302 on the adjacent light-emitting unit, so that the light-emitting unit 22 forms an electrically series-connected light-emitting unit array. In this embodiment, the maximum width of the connection electrode 60 is larger than the widths of the first extending electrode 202 and the second extending electrode 302 from a top view. In the top view, compared with the portion of the connection electrode 60 located in the trench 36 that substantially has a constant width, the portion of the connection electrode 60 that connects the first extending electrode 202 or the second extending electrode 302 has a width which is tapered in a direction from the trench 36 toward the semiconductor stack 12.

In another embodiment, the connection electrode 60 connects the first extending electrodes 202 on two adjacent light-emitting units 22, and/or the connection electrode 60 connects the second extending electrodes 302 on two adjacent light-emitting units 22, so that the light-emitting units 22 form different types of light-emitting unit array such as parallel connection, series connection or series-parallel connection.

The second pad electrode 301 on the light-emitting unit 22$a$ and the first pad electrode 201 on the light-emitting unit 22$f$ are used for wire bonding, so that the light-emitting device electrically connects to an external electronic component or a power source. The first insulating portion 230$a$ and the second insulating portion 230$b$ can block current from directly injecting into the semiconductor stack 12 through the pad electrodes, and to push current to spread through the extending electrodes 202 and 302 and the transparent conductive layer 18. The extending portion 23$c$ of the insulator 23 is disposed along and under the second extending electrode 302. Similarly, due to the extending portion 23$c$, the current spreads in the transparent conductive layer 18 on the insulator 23 rather than directly flows into the semiconductor stack 12 through the second extending electrode 302. Therefore, in this embodiment, the extension portion 23$c$ of the insulator 23 also functions as current blocking. The island portions 23$b$ of the insulator 23 are separately disposed along and under the first extending electrode 202, and also have a function of current blocking. The first extending electrode 202 discontinuously contacts the first semiconductor layer 121 through the intervals between the island portions 23$b$ so that the current is uniformly dispersed.

As shown in FIGS. 2A-2C, the lower semiconductor portion 12$b$ of each of the light-emitting units 22 includes a first side wall S1 neither covered by the connection electrode 60 nor the insulator 23, and a second side wall S2 under the middle portion 23$a$ of the insulator 23 and the connection electrode 60. The side wall of the upper semiconductor portion 12$a$ of each of the light-emitting units 22 is defined as an upper side wall labeled as Su. In the light-emitting device 1 having the light-emitting unit array, the two adjacent light-emitting units 22 are electrically isolated by the trenches 36, and then are electrically connected to each other by the conductive structures disposed across the trenches 36. However, due to the high aspect ratio of the trenches 36, the conductive structure may not cover the trenches 36 uniformly and is easily broken and damaged. Therefore, in order to ensure the reliability of the electrical connection between the adjacent light-emitting units 22, the connection electrode 60 and the middle portion 23$a$ of the insulator 2 attach on and cover the side walls of the semiconductor stack 12. An included angle $\theta 2$ between the second side wall S2 and the upper surface 10$a$ of the substrate 10 is an acute angle, and an included angle (not shown) between the upper side wall Su and the upper surface 10$a$ of the substrate 10 is an acute angle. In one embodiment, $\theta 2$ is less than 80 degrees; in another embodiment, $\theta 2$ is between 20 and 80 degrees. Furthermore, as shown in FIGS. 2A to 2C, an obtuse included angle $\theta 1$ is between the first side wall S1 of each of the light-emitting units 22 and the upper surface 10$a$ of the substrate 10. In one embodiment, $\theta 1$ is between 100 and 160 degrees.

As shown in FIG. 1 and FIG. 2A to FIG. 2D, in one embodiment, each of the light-emitting units 22 has a rectangular shape from the top view and has four edges, and wherein the first side walls S1 and at least one second side wall S2 are formed on the four edges. In one embodiment, the second side wall S2 and one of the first side walls S1 and are formed on the same edge of one light-emitting units 22, and the other first side walls S1 are formed on the edge other than the edge where the second side wall S2 are located. In another embodiment, in a top view of any of the light-emitting units, the length of the second side wall S2 extending along a first edge is substantially equal to the length of the first edge where the second side wall S2 is located, and the first side walls S1 are located on the edges other than the first edge.

In one embodiment, as shown in FIG. 1 and FIG. 2D, the length of the second side wall S2 along the edge of the light-emitting unit 22 is equal to or greater than the length of the middle portion 23$a$ along the edge of the light-emitting unit 22. For example, the length of the second side wall S2 along the edge of the light-emitting unit 22 is greater than 10 μm. In this way, the insulator 23 conformally adheres and covers the side walls of the semiconductor stack 12.

Figure 3:
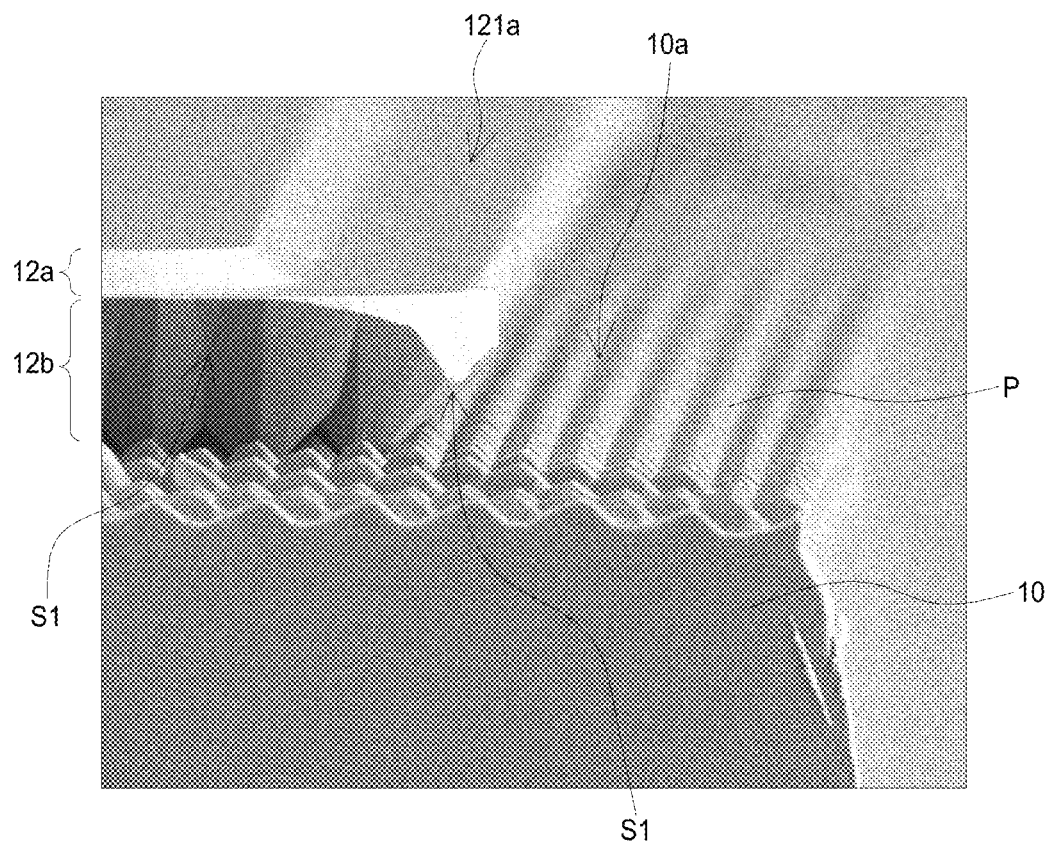
FIG. 3 shows a scanning electron microscope (SEM) image of the light-emitting device 1.

FIG. 3 shows a scanning electron microscope (SEM) image of the side wall of the semiconductor stack 12 in the first embodiment. The upper surface 10$a$ of the substrate 10 has pattern structures P, and the surface of the first side wall S1 is uneven. More specifically, the first side wall S1 has rugged surface with concave and convex.

Figure 4:
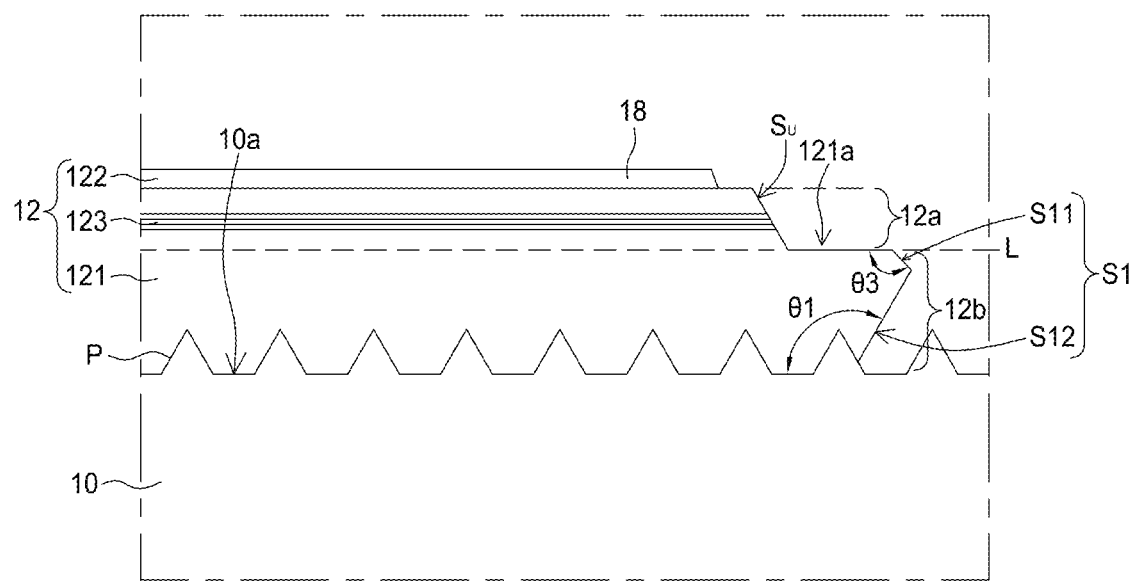
FIG. 4 shows a partial cross-sectional view of a light-emitting device 1 in accordance with another embodiment of the present application.

FIG. 4 is a partially enlarged cross-sectional view of the side wall of the semiconductor stack 12 in the light-emitting device in accordance of a second embodiment. The structure in the second embodiment is similar to that of the light-emitting device 1 in the first embodiment, and the main difference is that the first side wall S1 includes a first sub-side wall S11 connected to the upper surface 121$a$ of the first semiconductor layer 121 and a second sub-side wall S12 located between the first sub-side wall S11 and the substrate 10. The included angle $\theta 3$ between the first sub-side wall S11 and the upper surface 121$a$ of the first semiconductor layer 121 is an obtuse angle, and the included angle $\theta 1$ between the second sub-side wall S12 and the upper surface 10$a$ of the substrate is an obtuse angle. In the second embodiment, the light can be refracted and/or reflected by the first side wall S1 having the sub-side walls and finally extracted.

In an embodiment, an angle between the first sub-side wall S11 and the second sub-side wall S12 is greater than or equal to 90 degrees.

In one embodiment, $\theta 3$ is greater than or equal to 90 degrees; in one embodiment, $\theta 3$ is between 100 and 160 degrees. In a cross-sectional view, the length of the second sub-side wall S12 is greater than that of the first sub-side wall S11.

In one embodiment which the pattern structures P are formed on the upper surface 10$a$ of the substrate, the surface of the second sub-side wall S12 is uneven. More specifically, the second sub-side wall S12 has rugged surface with concave and convex. In one embodiment, the second sub-side wall S12 is rugged and the first sub-side wall S11 is substantially even. In one embodiment, the surface roughness of the second sub-side wall S12 is greater than the surface roughness of the first sub-side wall S11.

Figure 5A:
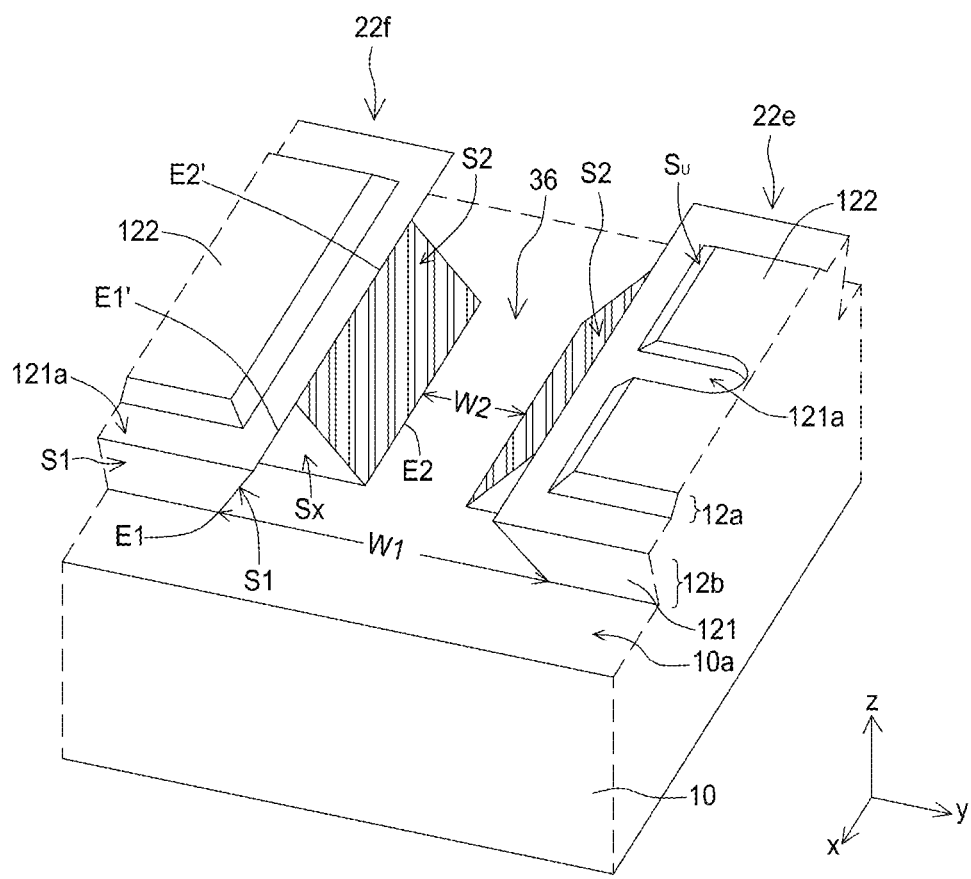
FIG. 5A shows a stereoscopic schematic diagram of the light-emitting device 1.

FIG. 5A is a partial stereoscopic schematic diagram of the semiconductor stacks 12 shown from the X1 direction in FIG. 1. In order to clearly show the structural relationship of the semiconductor stacks 12 between two adjacent light-emitting units 22, FIG. 5A only shows the semiconductor stacks 12 of the light-emitting units 22e and 22f. The patterned structures P, the insulator 23, the connection electrode 60, the first extending electrode 202, the second extending electrode 302 and the transparent conductive layer 18 are not shown. As shown in FIG. 5A, the light-emitting units 22e and 22f are adjacent and spaced apart by the trench 36 therebetween. The first side wall S1 and the second side wall S2 are formed on each of the edges of the light-emitting units 22e and 22f that face each other. The first side wall S1 and the second side wall S2 have a first lower edge E1 and a second lower edge E2, respectively; wherein the second lower edge E2 is closer to the adjacent light-emitting unit than the first lower edge E1. In the top view shown in FIG. 2D, the bottom width W2 of the trench 36 below the insulator 23 is the distance between the second lower edges E2 of the second side walls S2 of the adjacent light-emitting units 22. The bottom width W1 of the other portions of the trench 36 as shown in FIG. 5A is the distance between the first lower edges E1 of the first side walls S1 of the two adjacent light-emitting units 22; wherein the bottom width W2 is smaller than the bottom width W1. In addition, the first upper edge E1' of the first side wall S1 and the second upper edge E2' of the second side wall S2 are connected and form a straight line. In another embodiment, the first upper edge E1' of the first side wall S1 and the second upper edge E2' of the second side wall S2 are not connected in a straight line, that is, the two upper edges are not aligned. The second upper edge E2' protrudes toward the y-axis direction and is closer to the adjacent light-emitting unit than the first upper edge E1'.

In addition, the patterned structures P between the two adjacent second side walls S2 and the patterned structures P on the other regions of the substrate 10 have different sizes and/or different shapes. For example, the patterned structure P located between two second side walls S2 of two adjacent light-emitting units or directly below the middle portion 23a of the insulator 23 is conical or hemispherical, while the patterned structure P on the other regions of the substrate 10, for example, located between two first side walls S1 of two adjacent light-emitting units has a polygonal structure, such as a mesa with a triangular (or polygonal) bottom surface or a pyramid with a triangular (or polygonal) bottom surface.

In addition, the side wall of the lower semiconductor portion 12b further includes a clamped surface Sx between the first side wall S1 and the second side wall S2. In a cross-sectional view, the clamped surface Sx substantially has a triangular shape and the bottom edge of the triangle connects to the upper surface 10a of the substrate 10. The acute angle formed between the second side wall S2 and the upper surface 10a of the substrate ensures the reliability of the electrical connection between the adjacent light-emitting units 22; the obtuse angle formed between the first side wall S1 and the upper surface 10a of the substrate can reduce the internal total reflections in the semiconductor stack, which facilitates light extracted from the semiconductor stack 12, thereby improving the light extraction efficiency of the light-emitting device 1. When the connection electrode 60 is a light-shielding material such as a non-transparent metal, the light shielded by the connection electrode 60 on the second side wall S2 can be reflected and/or refracted and then is extracted from the clamped surface Sx, so that the light extraction efficiency of the light-emitting device 1 can be improved.

When the distance between the plurality of light-emitting units is too close, the light emitted by the semiconductor stack may be absorbed by the adjacent light-emitting units or the layers therebetween, resulting in poor light-emitting efficiency. Therefore, in an embodiment, the minimum bottom width of the trenches 36 is greater than 5 μm; more specifically, the distance W2 between two second lower edges E2 of the two second side walls S2 facing each other in the two adjacent light-emitting units is greater than 5 μm.

Figure 5B:
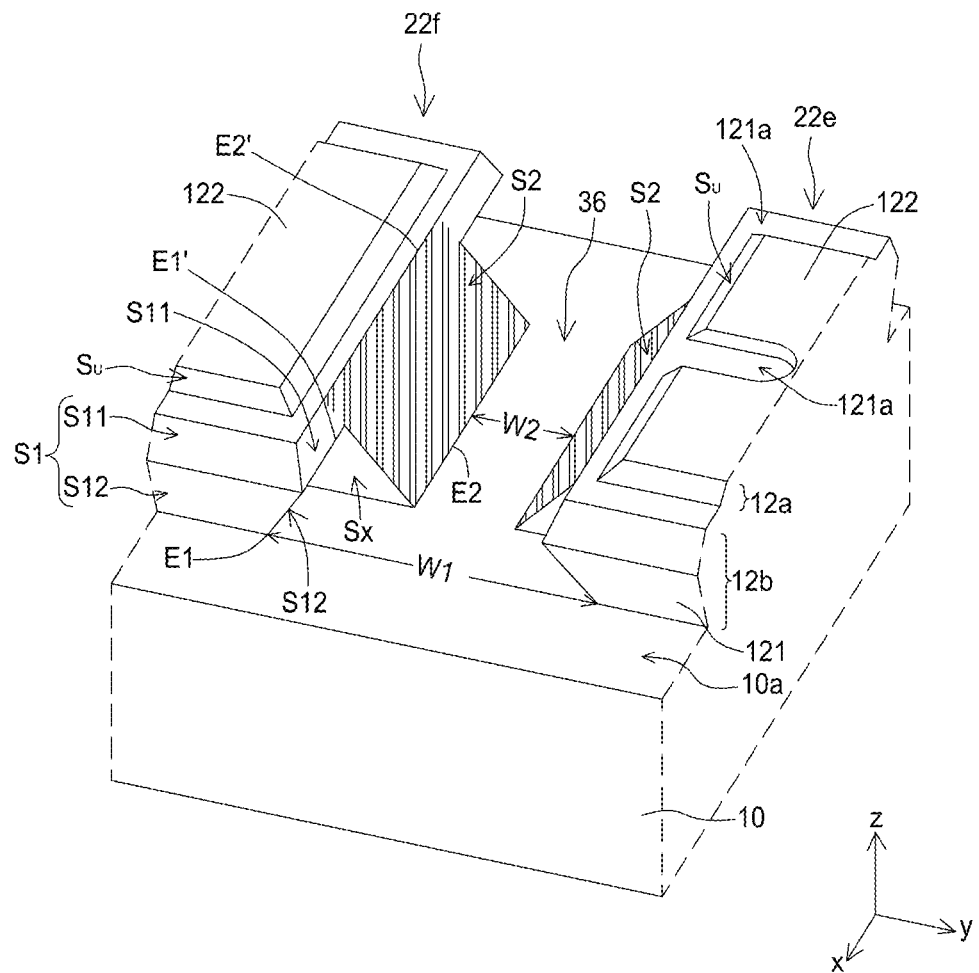
FIG. 5B shows a stereoscopic schematic diagram of a light-emitting device 1 in accordance with another embodiment of the present application.

Similarly, FIG. 5B is a partial stereoscopic schematic diagram of the semiconductor stacks 12 of the light-emitting device shown from the X1 direction in accordance with the second embodiment. Different from FIG. 5A, the first side wall S1 shown in FIG. 5B includes the first sub-side wall S11 connected to the upper surface 121a of the first semiconductor layer 121 and the second sub-side wall S12 located between the first sub-side wall S11 and the substrate 10.

The above embodiments are illustrated by the cross-sectional views taken along the A-A' line, the B-B' line and the C-C' line shown in FIG. 1; however, people having ordinary skill in the art can understand the side wall structure of the semiconductor stack of each light-emitting unit 22 by the disclosure in the present application. For example, no insulator 23 and no connection electrode 60 are disposed on the side walls of the semiconductor stacks between two adjacent light-emitting units 22c and 22f; and no insulator 23 and no connection electrode 60 are disposed on the side walls of the semiconductor stacks between two adjacent light-emitting units 22a and 22d, thus the first side walls S1 as shown in FIG. 2C which form obtuse angles with the upper surface 10a of the substrate are formed between the light-emitting units 22c and 22f and between the light-emitting units 22a and 22d. For example, the first side walls S1 as shown in the left side and the right side in FIG. 2C are formed on the semiconductor stack which is adjacent to the periphery of the light-emitting device 1 in each light-emitting unit 22.

Figure 6A:
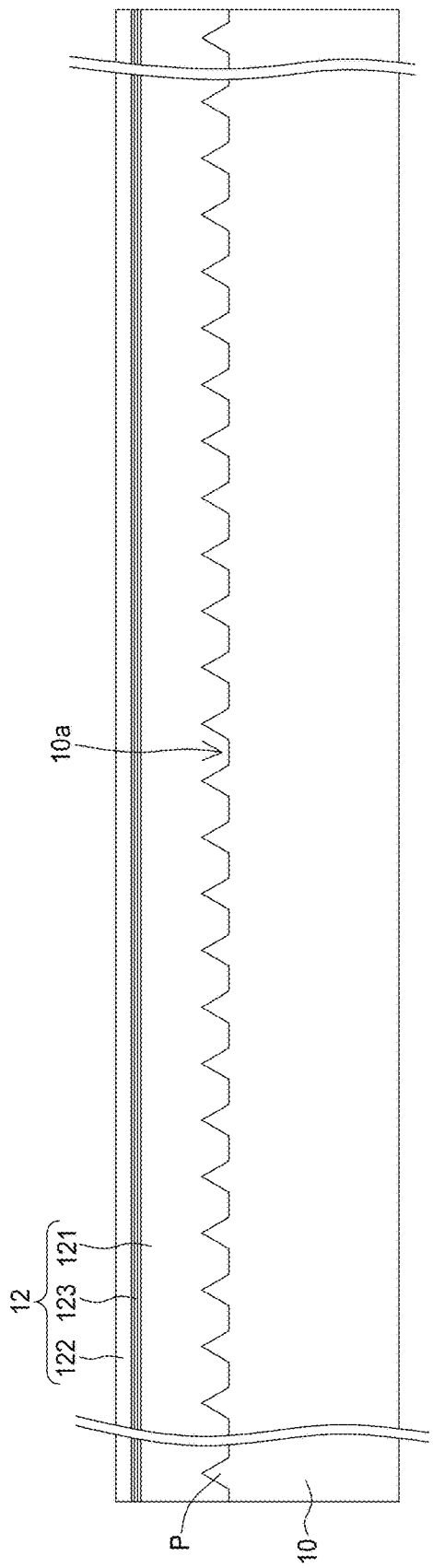
Figure 6B:
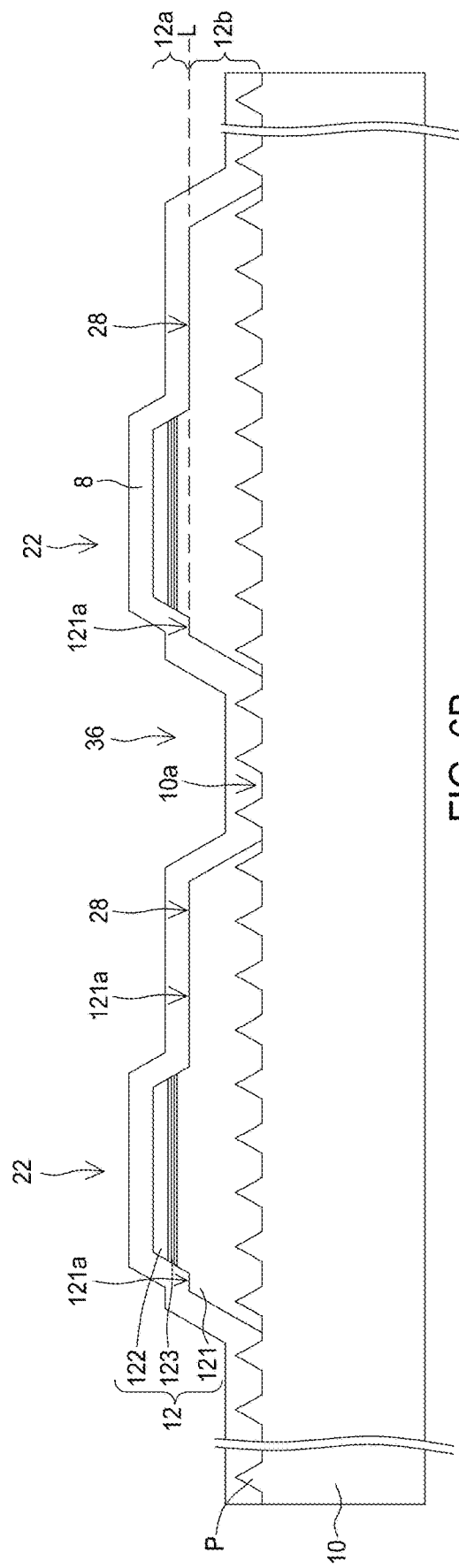

FIGS. 6A-6H show a method of manufacturing the light-emitting device 1 in accordance with an embodiment of the present application. First, as shown in FIG. 6A, the semiconductor stack 12 is formed on the substrate 10. In the present embodiment, the substrate in the manufacturing method and the substrate of the light-emitting device are denoted by the same labels. The substrate 10 in the manufacturing method can be a wafer or a carrier having an area sufficient for subsequent processing. The substrate 10 and the semiconductor stack 12 formed thereon constitute a semiconductor wafer. Next, as shown in FIG. 6B, a portion of the semiconductor stack 12 is removed until the upper surface 10a of the substrate 10 is exposed; thereby the trench 36 is formed. A portion of the semiconductor stack 12 is further removed to expose the upper surface 121a of the first semiconductor layer 121 and to form the platform 28. The trench 36 separates the semiconductor stack 12 into a plurality of regions defining the plurality of light-emitting units 22. Next, a protective layer 8 is formed on all of the light-emitting units 22, the trenches 36, and the upper surface 10a of the substrate 10. In one embodiment, the protective layer 8 has a thickness of 500 Å to 5000 Å, and the material thereof can be selected from silicon oxide, silicon nitride, or a combination thereof. The protective layer 8 can be formed by chemical vapor deposition (CVD), atomic layer deposition (ALD), or spin-coating.

Figure 6C:
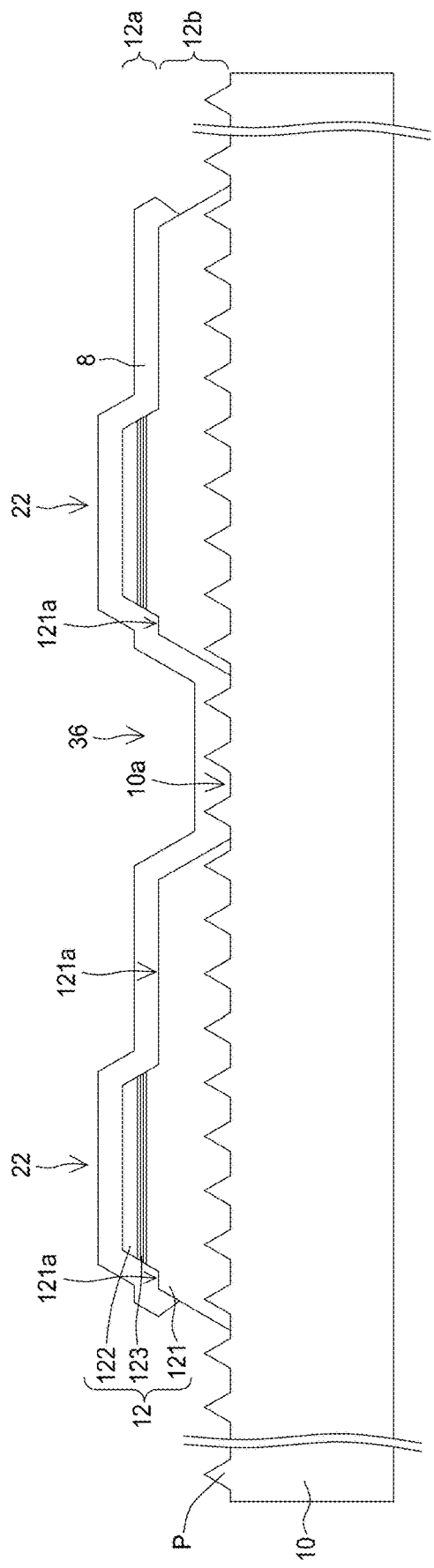
Figure 6D:
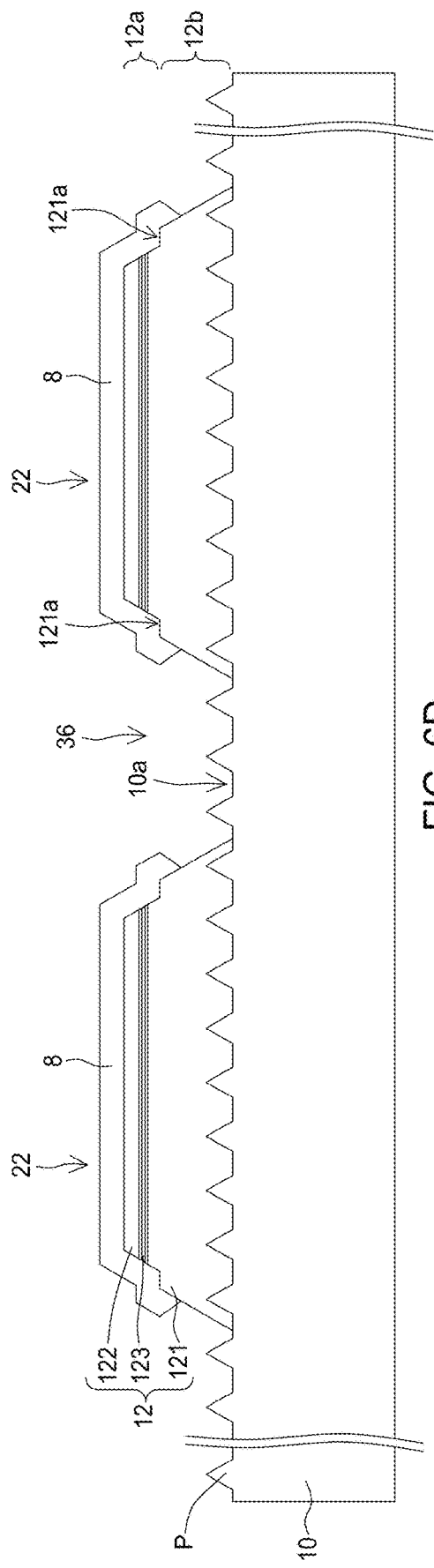

Next, as shown in FIG. 6C and FIG. 6D, openings in the protective layer are formed by photolithography or the like. FIGS. 6C and 6D show cross-sectional views taken along the B-B' line and the C-C' line of FIG. 1 in the present step of the manufacturing method, respectively. The openings are formed along the edges of each of the light-emitting units 22 and the trench 36 except for the portions of the edges where the connection electrode 60 and the insulator 23 are to be formed thereon. That is, the portions of the edges where the connection electrode 60 and the insulator 23 are to be formed thereon do not have the opening.

Next, as shown in FIGS. 6E and 6F, a semiconductor stack side wall etching process is performed. FIGS. 6E and 6F show cross-sectional views taken along the B-B' line and C-C' line of FIG. 1 in the present step of the manufacturing method, respectively. In one embodiment, wet etching is used to remove the portions of the lower semiconductor portion 12b in the openings of the protective layer to form first side walls S1. In another embodiment, the etching process further includes etching the patterned structures P in the openings of the protective layer. In one embodiment, the etchant can be selected from $H_2SO_4$, $H_3PO_4$, HCl, HF, or a combination thereof. In another embodiment, after the first sidewall S1 is formed, a roughening step can be performed on the first sidewall S1. For example, the first side wall S1 is etched by KOH to form a rough structure thereon. In one embodiment, after the etching process, the patterned structures P covered by the protective layer 8 and the patterned structures P not covered by the protective layer 8 have different sizes and/or different shapes. For example, the patterned structures P covered by the protective layer 8 have conical or hemispherical structure; and after the etching process, the patterned structures P not covered by the protective layer 8 have polygonal structure, such as mesa with a triangular (or polygonal) bottom surface or a pyramid with a triangular (or polygonal) bottom surface. The included angle θ1 between the first side wall S1 and the upper surface 10a of the substrate 10 can be controlled by the composition of the etchant, the etching time and the etching temperature.

Next, as shown in FIGS. 6G and 6H, the protective layer 8 is removed. FIGS. 6G and 6H show cross-sectional views taken along the B-B' line and the C-C' line of FIG. 1 in the present step of the manufacturing method, respectively. After the protective layer 8 is removed, subsequent processes such as forming the insulator, forming the transparent conductive layer, and forming the conductive structure are performed. Finally, the semiconductor wafer is diced to form the plurality of light-emitting devices 1, and each light-emitting device 1 includes the plurality of light-emitting units 22 connected in series. In the dicing process, in one embodiment, the back surface of the substrate 10 is irradiated by a laser beam 17, so that a modification region (not shown) is formed inside the substrate 10, and cracks are formed along the crystal plane of the substrate from the modification region to separate the light-emitting devices. The lower semiconductor portion 12b of each of the light-emitting units 22 includes the first side walls S1 and the second side walls S2 on which the connection electrode 60 and the insulator 23 are formed.

Figure 7:
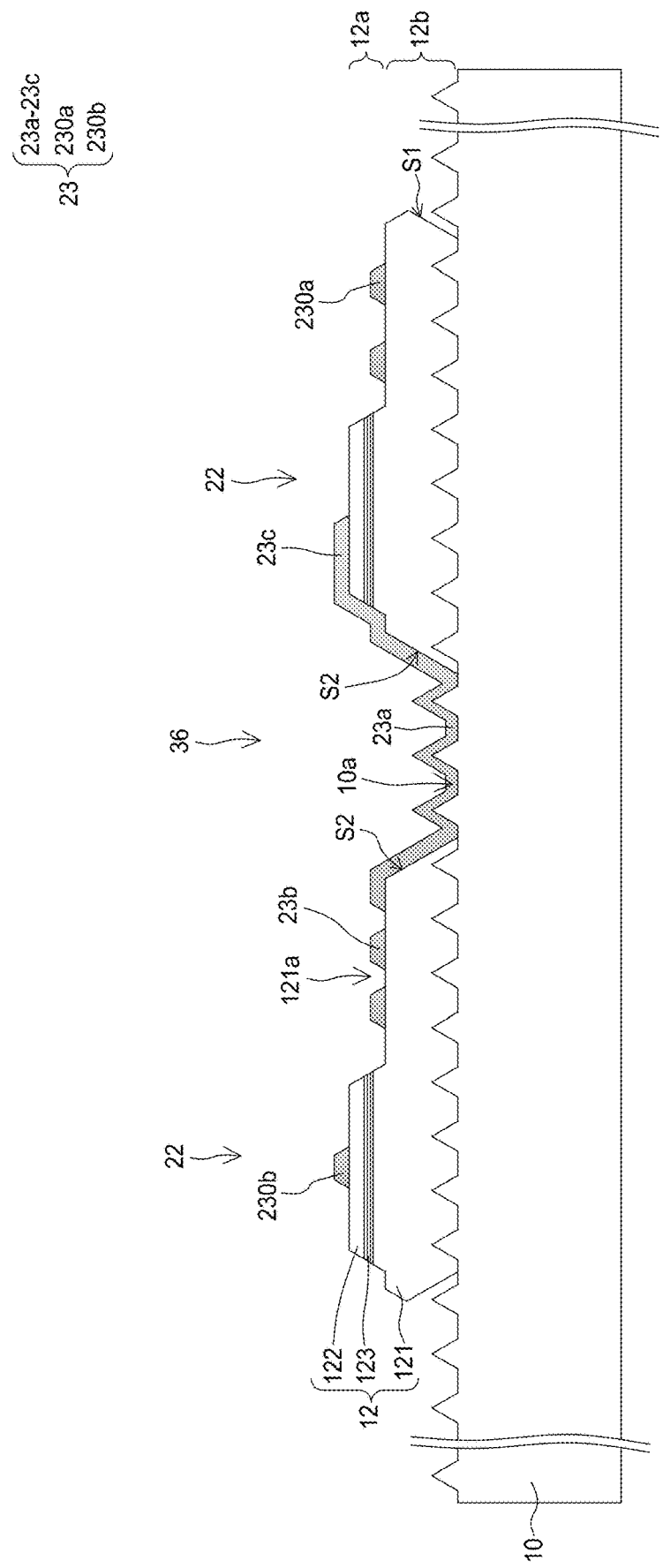
FIG. 7 shows a manufacturing method of a light-emitting device 1 in accordance with another embodiment of the present application.

In another embodiment as shown in FIG. 7, the protective layer 8 is left on the semiconductor stacks 12 and then etched to form the insulator 23 rather than completely removed. After that, the transparent conductive layer and the conductive structures are formed (not shown).

In one embodiment, by adjusting the width of the opening of the protective layer and/or the width of the trench 36 before the semiconductor stack side wall etching process, incorporating with different etching conditions as described above, the first sidewall S1 as shown in the first embodiment or the first side wall S1 having a plurality of sub-side walls as shown in the second embodiment can be obtained.

Figure 8:
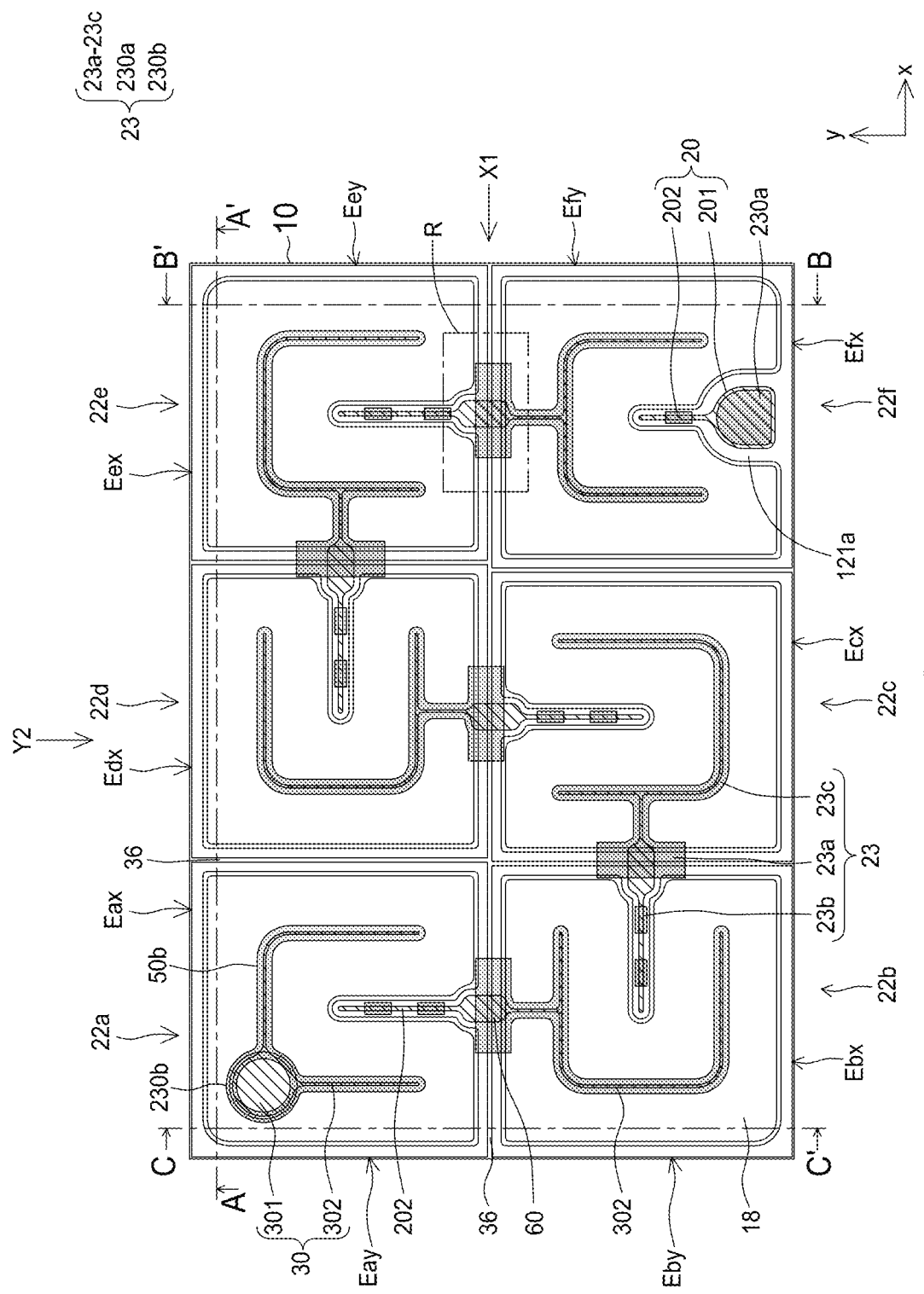
FIG. 8 shows a top view of a light-emitting device 3 in accordance with an embodiment of the present application.
Figure 9A:
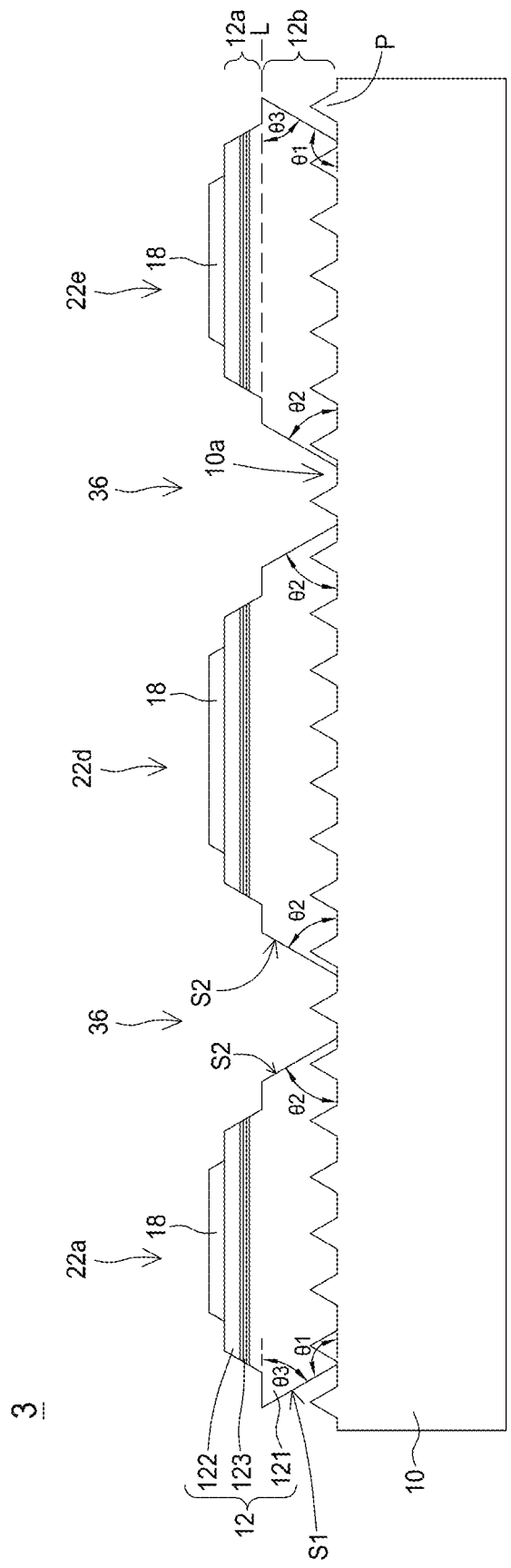
FIGS. 9A and 9B show cross-sectional views of the light-emitting device 3.
Figure 9B:
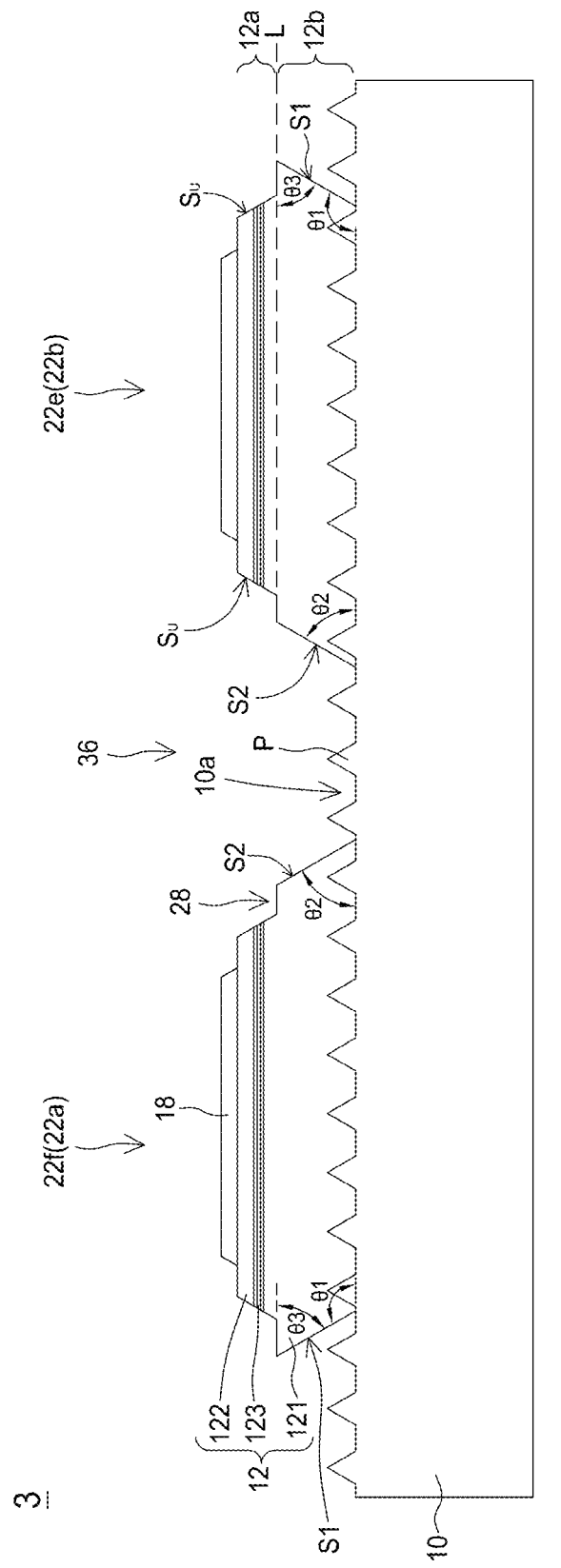

FIG. 8 shows a light-emitting device 3 in accordance with the third embodiment of the present application. FIG. 9A shows a cross-sectional view taken along the A-A' line in FIG. 8. FIG. 9B shows a cross-sectional view taken along the B-B' line or the C-C' line in FIG. 8.

The structure of the light-emitting device 3 of the third embodiment is similar to that of the light-emitting device 1 of the first embodiment, and the main difference is that the first side wall S1 which forms an obtuse angle with the upper surface 10a of the substrate is provided only on the side walls of the semiconductor stacks 12 around the light-emitting device 3. More specifically, the first side wall S1 is only disposed on the edges of the light-emitting units 22 arranged in the periphery of the light-emitting device 3 and is not disposed on adjacent edges between any two adjacent light-emitting units 22. In this embodiment, the light-emitting units 22 of the light-emitting device 3 are arranged in a 3×2 two-dimensional array, and the light-emitting units 22a-22f are all located adjacent to the periphery of the light-emitting device 3 and therefore the light-emitting units 22a-22f can be defined as peripheral light-emitting units. The first side wall S1 is disposed on the edges Eax, Edx, Eex, Eey, Efy, Efx, Ecx, Ebx, Eby, and Eay of the light-emitting units 22a-22f; and the second side wall S2 which forms an acute angle with the upper surface 10a of the substrate is disposed on adjacent edges between any two adjacent light-emitting units 22 (22a-22f).

As shown in FIGS. 9A and 9B, in the cross-sectional views taken along the A-A' line or in a side view viewing from the Y2 direction in FIG. 8, the lower semiconductor portions 12b of the light-emitting unit 22a and the light-emitting unit 22e have parallelogram-like shapes or parallelogram shapes. The parallelogram-like shape includes a pair of parallel opposite sides and a pair of acute diagonal angles. These two acute diagonal angles make the other pair of opposite sides of the parallelogram-like shape not parallel while they are not equal. As shown in FIG. 8, FIG. 9A and FIG. 9B, in the light-emitting unit 22a: an included angle θ1 between the first side wall S1 at the peripheral edge Eay and the upper surface 10a is an obtuse angle and an included angle θ3 between the first side wall S1 at the peripheral edge Eay and the upper surface of the lower semiconductor portion 12b is an acute angle; the included angle θ1 between the first side wall S1 at the peripheral edge Eax and the upper surface 10a is an obtuse angle, and in a side view viewing from the Y2 direction, the first side wall S1 has a parallelogram-like shape or a parallelogram shape; and the side walls of the lower semiconductor portion 12b facing the light-emitting units 22d and 22b of the light-emitting unit 22a are the second side walls S2 that form acute angles with the upper surface 10a. That is, the first side wall S1 is disposed on two peripheral edges Eax and Eay of the light-emitting unit 22a, and the second side wall S2 is disposed on the other two edges of the light-emitting unit 22a.

In the side view viewing from the Y2 direction in FIG. 8, in an embodiment that the include angle θ3 between the first side wall S1 at the peripheral edge and the upper surface of the lower semiconductor portion 12b and the include angle θ2 between the second side wall S2 and the upper surface 10a are substantially equal, the lower semiconductor portion 12b of the light-emitting unit 22 has a parallelogram shape. In another embodiment that θ3 and θ2 are not equal, the lower semiconductor portion 12 of the light-emitting unit 22a has a parallelogram-like shape. In one embodiment, the difference between θ3 and θ2 is less than 40 degrees. The lower semiconductor portion 12b of the light-emitting unit 22e includes the same structure as that of the light-emitting unit 22a.

As shown in FIG. 9A, in the light-emitting unit 22d: the side walls of the lower semiconductor portion 12b facing the light-emitting units 22a, 22c, and 22e are the second side walls S2 which form acute angles with the upper surface 10a of the substrate 10. In the cross-sectional structure taken along the A-A' line of the light-emitting unit 22d, or in the side view viewing from the Y2 direction in FIG. 8, the lower semiconductor portion 12b of the light-emitting unit 22d has a trapezoidal shape. The angles of the two bottom corners of the trapezoid, that is, the two included angles θ2 between the second side wall S2 and the upper surface 10a in the light-emitting unit 22d, can be equal or unequal. The first sidewall S1 on the peripheral edge Edx of the light-emitting unit 22d forms an obtuse included angle with the upper surface 10a of the substrate. That is, the first sidewall S1 is disposed on the peripheral edge Edx of the light-emitting-unit 22d, and the second sidewalls S2 are disposed on the other three edges of the light-emitting unit 22d.

FIG. 9B shows a cross-sectional view taken along the B-B' line or the C-C' line in FIG. 8. As shown in FIG. 9B, the cross-sectional structure taken along the B-B' line of the light-emitting units 22f and 22e, or in the side view viewing from the X1 direction in FIG. 8, the lower semiconductor portions 12b of the light-emitting unit 22f and 22e respectively have a parallelogram-like shape or a parallelogram shape. In the light-emitting device 22f: the first side wall S1 at the peripheral edge Efx forms an obtuse included angle θ1 with the upper surface of the lower semiconductor portion 12b; and the second side wall S2 facing the light-emitting unit 22e forms an acute angle with the upper surface 10a.

In the side view viewing from the X1 direction in FIG. 8, in an embodiment that θ3 and θ2 are substantially equal, the lower semiconductor portions 12b of the light-emitting units 22e and 22f have parallelogram shapes. In another embodiment that θ3 and θ2 are not equal, the lower semiconductor portions 12 of the light-emitting units 22e and 22f have parallelogram-like shapes. In one embodiment, the difference between θ3 and θ2 is less than 40 degrees. Similarly, in the side view viewing from the direction opposite to X1, the lower semiconductor portions 12b of the light-emitting units 22a and 22b include the same structure as described above. Here the details are not repeated again.

The lower semiconductor portion 12b of the light-emitting unit 22c includes the same structure as the light-emitting unit 22d, and the lower semiconductor portion 12b of the light-emitting unit 22b includes the same structure as the light-emitting unit 22a.

In one embodiment, as described in the aforementioned light-emitting device 1, the surface of the first sidewall S1 is uneven.

In each light-emitting unit 22 of the light-emitting device 3, the side walls of the lower semiconductor portions 12b facing the adjacent light-emitting units 22 are the second side wall S2 that form acute angles with the upper surface 10a of the substrate, and the connection electrode 60 is formed on these second side walls S2 to ensure the reliability of the electrical connection between adjacent light-emitting units 22. The side walls of the lower semiconductor portions 12b located on the peripheral edges of the light-emitting device 3 are the first side walls S1 that form obtuse angles with the upper surface 10a of the substrate. The total internal reflection of the light inside the semiconductor stack can be reduced so that light can be extracted from the semiconductor stacks 12 and the light extraction efficiency of the light-emitting device 3 is improved.

In the embodiment, the arrangement and number of the light-emitting units 22 in the light-emitting device 3 are not limited to the 3×2 two-dimensional array. The light-emitting device 3 may include light-emitting unit array with single row or single column, a 2×2 light-emitting unit array, or a light-emitting unit array greater than 3×2. In one embodiment that light-emitting device 3 has a single row of light-emitting unit array and each light-emitting unit is a rectangle having four edges, the first side walls S1 are located on three edges of each of the beginning light-emitting unit and the end light-emitting unit of the array. The second side walls S2 are located on the other edge of each of the beginning light-emitting unit and the end light-emitting unit of the array. In another embodiment that the light-emitting device 3 includes the light-emitting unit array greater than 3×3 and each light-emitting unit is rectangular, the second side walls S2 are formed on all the four edges of at least one light-emitting unit.

In the embodiment, the first side wall S1 may include the first sub-side wall S11 connected to the upper surface 121a of the first semiconductor layer 121 and the second sub-side wall S12 located between the first sub-side wall S11 and the substrates 10, as shown in FIG. 4, An included angle θ3 between the first sub-side wall S11 and the upper surface 121a of the first semiconductor layer 121 is an obtuse angle, and an included angle θ1 between the second sub-side wall S12 and the upper surface 10a of the substrate is an obtuse angle.

Figure 10A:
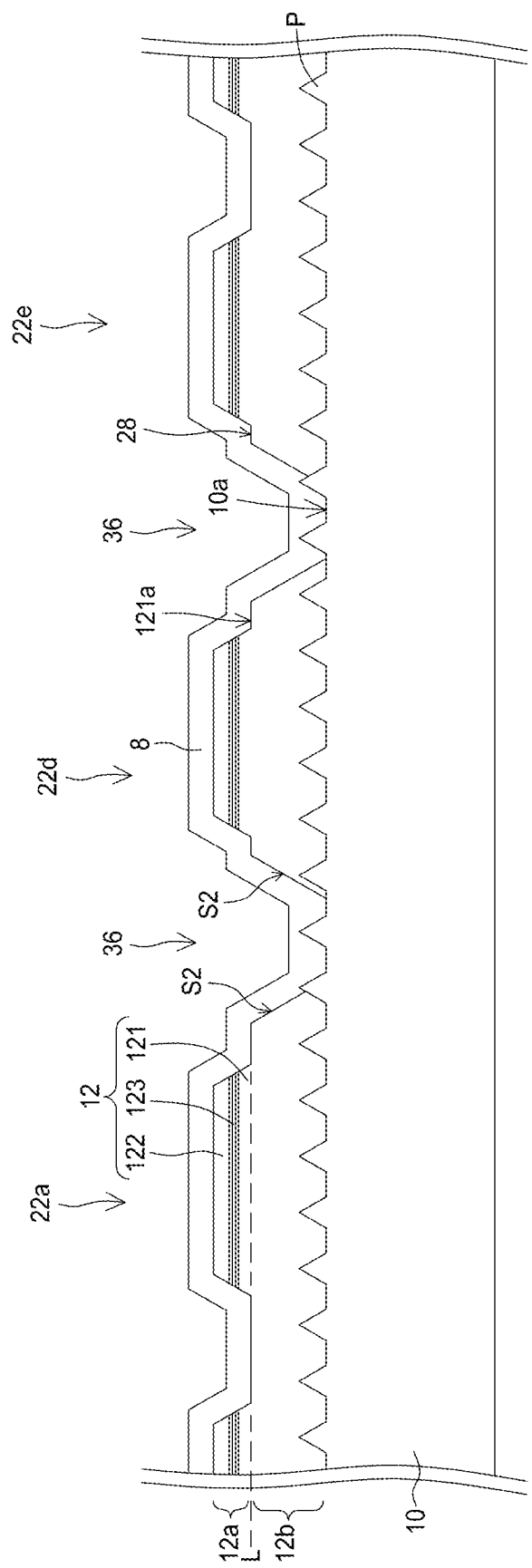
FIGS. 10A to 10C show a manufacturing method of the light-emitting device 3 in accordance with an embodiment of the present application.
Figure 10B:
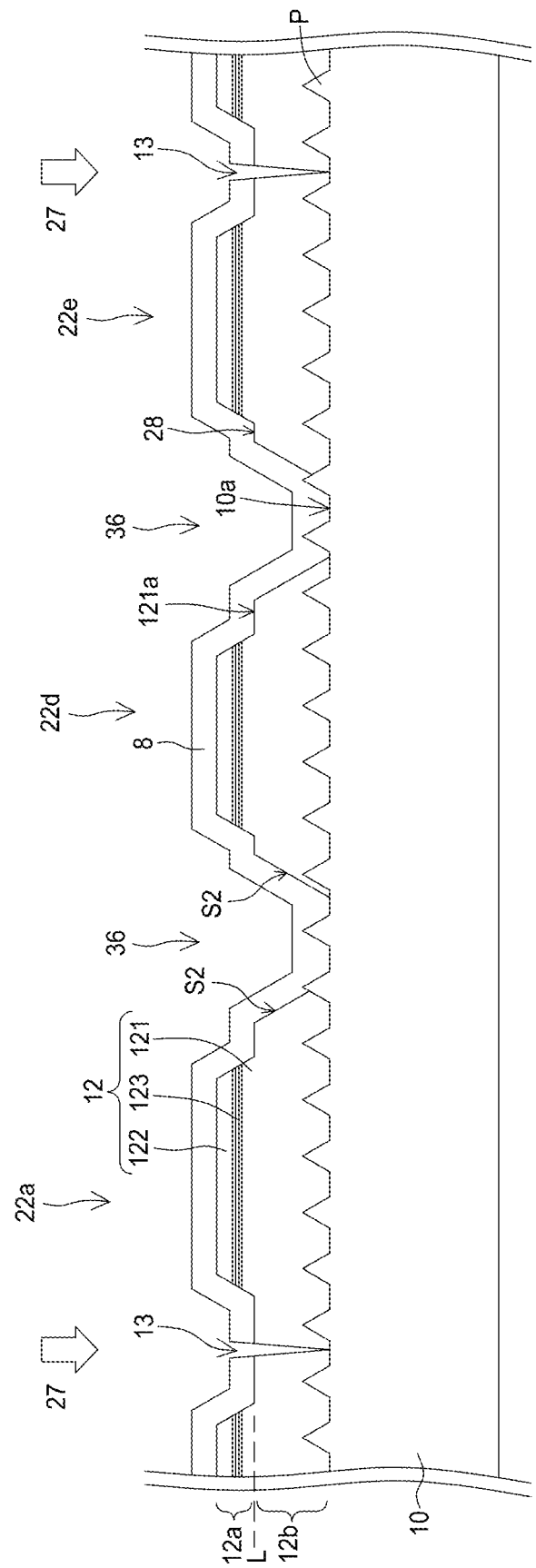
Figure 10C:
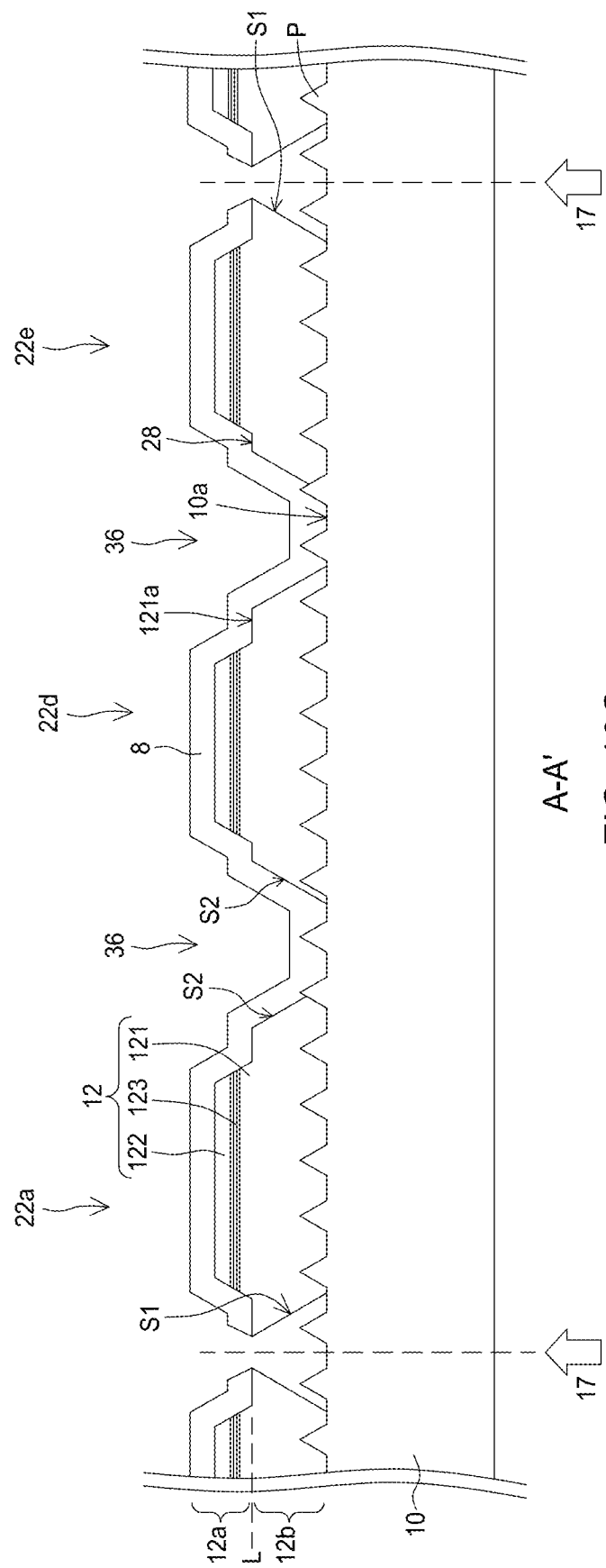

FIGS. 10A-10C shows a method for manufacturing the light-emitting device 3 in accordance with an embodiment of the present application. FIG. 10A shows a cross-sectional view taken along the A-A' line at one step the manufacturing method. First, as shown in FIG. 10A, as described in the previous embodiment, the semiconductor stack 12 is formed on the substrate 10 to form a semiconductor wafer; then, a portion of the semiconductor stack 12 is removed to expose the upper surface 10a of the substrate 10 and to form the trench 36, and another portion of the semiconductor stack 12 is removed to expose the upper surface 121a of the first semiconductor layer 121, thereby forming the platform 28. The semiconductor stack 12 is separated into a plurality of regions defined as the plurality of light-emitting units 22 by the trenches 36. In this step, the lower semiconductor portions 12b of the adjacent light-emitting device 3 in the semiconductor wafer are connected. Next, a protective layer 8 is formed on all the light-emitting units 22, the trenches 36, and the upper surface 10a. In one embodiment, the protective layer 8 has a thickness of 500 Å to 5000 Å, and the material thereof can be selected from silicon oxide, silicon nitride, or a combination thereof. The protective layer 8 can be formed by chemical vapor deposition (CVD), atomic layer deposition (ALD), or spin-coating.

Next, a step of forming scribing lines 13 is performed. As shown in one embodiment of FIG. 10B, a laser 27 is irradiated from the upper surface of the protective layer 8. The laser 27 cuts the semiconductor stack 12 downward from the upper surface of the protective layer 8 to form the scribing lines 13. In a cross-sectional view, the scribing line 13 extends downward to a depth within the lower semiconductor stack 12b, or to a depth within the substrate 10, or to an upper surface 10a of the substrate. At the same time, the scribing lines 13 define the plurality of light-emitting devices 3 on the semiconductor wafer. That is, the scribing lines 13 define the periphery of each light-emitting device 3. In one embodiment, the laser 27 cuts the semiconductor stack 12 from the upper surface of the protective layer 8 downward to a depth within the substrate 10 to form a rough region (not shown) inside the substrate 10. In another embodiment, the scribing lines 13 is formed by dry etching such as inductively coupled plasma (ICP) to etch the upper surface of the protective layer 8 downward into a depth of the semiconductor stack 12.

Next, as shown in FIG. 10C, a semiconductor stack side wall etching process is performed. In one embodiment, wet etching is applied to remove a part of the lower semiconductor portion 12b in the scribing line 13 to form the first sidewall S1. In another embodiment, the etching process further includes etching the patterned structure P on the upper surface 10a of the substrate under the scribing line 13. In one embodiment, the etchant includes $H_2SO_4$, $H_3PO_4$, HCl, HF, or a combination thereof. In one embodiment, after forming the first sidewall S1, a roughening step may be performed on the first sidewall S1. For example, the first sidewall S1 is etched with KOH to form a rough structure thereon (not shown). In one embodiment, after the etching process, the patterned structures P covered by the protective layer 8 and the patterned structures P not covered by the protective layer 8 have different sizes and/or different shapes. For example, the patterned structures P covered by the protective layer 8 have conical or hemispherical structure; and the patterned structures P not covered by the protective layer 8 after the etching process have polygonal structure, such as mesa with a triangular (or polygonal) bottom surface or pyramid with a triangular (or polygonal) bottom surface. The included angle θ1 between the first side wall S1 and the upper surface 10a of the substrate 10 can be controlled by the composition of the etchant, the etching time, and the etching temperature.

Next, the protective layer 8 is removed. Subsequent processes such as forming the insulator, forming the transparent conductive layer, and forming the conductive structure are performed after the protective layer 8 is removed. In another embodiment, the protective layer 8 is left on the semiconductor stacks 12 and then etched to form the insulator 23 rather than completely removed. After that, the transparent conductive layer and the conductive structures are formed (not shown).

Finally, the semiconductor wafer is diced into a plurality of light-emitting devices 3 along the scribing line 13. The dicing method is the same as the manufacturing method of the light-emitting device 1 described above and is not repeated here.

In one embodiment that the laser 27 cuts the semiconductor stack 12 downward to a depth within the substrate 10 to form a rough region inside the substrate 10, a rough region is formed correspondingly on the side wall of the substrate 10 and is connected to the upper surface 10a after the semiconductor wafer is split into the plurality of light-emitting devices 3.

In another embodiment of the manufacturing method of the light-emitting device 3, the scribing line 13 is not formed. The plurality of the light-emitting devices 3 are defined by the trenches 36 as described in the manufacturing method of the light-emitting device 1. The semiconductor stack 12 is etched downward, for example, by dry etching, until the upper surface 10a of the substrate to form the trenches 36. Next, the protective layer 8 is formed on all the light-emitting units 22, the trenches 36, and the upper surface 10a. Next, lithography and etching are used to form openings of the protective layer. However, being different form the manufacturing method of the light-emitting device 1, the openings of the protective layer are only formed along the periphery of each light-emitting device 3 rather than along the edges of each light-emitting unit and the trenches 36. Similarly, wet etching is performed to remove a portion of the lower semiconductor 12b in the openings to form the first side walls S1 adjacent to the periphery of the light-emitting device 3 or around the light-emitting device 3.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a substrate, comprising an upper surface;
a first light-emitting unit and a second light-emitting unit, formed on the upper surface, wherein each of the first light-emitting unit and the second light-emitting unit comprises a lower semiconductor portion and an upper semiconductor portion; and
a conductive structure electrically connecting the first light-emitting unit and the second light-emitting unit;
wherein the lower semiconductor portion of the first light-emitting unit comprises a first side wall and a first upper surface; and
wherein the first side wall comprises a first sub-side wall and a second sub-side wall, an obtuse angle is formed between the first sub-side wall and the first upper surface and another obtuse angle is formed between the second sub-side wall and the upper surface.

2. The light-emitting device according to claim 1, wherein the first sub-side wall and the second sub-side wall are connected.

3. The light-emitting device according to claim 1, wherein the lower semiconductor portion of the first light-emitting unit further comprises a second side wall facing the second light-emitting unit, and the conductive structure is formed on the second side wall and the second light-emitting unit; and wherein an acute angle is formed between the second side wall and the upper surface.

4. The light-emitting device according to claim 3, wherein:
the first light-emitting unit and the second light-emitting unit are adjacent;
the first side wall faces the second light-emitting unit;
each of the first side wall and the second side wall comprises a lower edge; and
the lower edge of the second side wall is closer to the second light-emitting unit than the lower edge of the first side wall.

5. The light-emitting device according to claim 3, wherein:
the first light-emitting unit and the second light-emitting unit are adjacent;
the first side wall faces the second light-emitting unit;
each of the first side wall and the second side wall comprises an upper edge; and
the upper edge of the second side wall is closer to the second light-emitting unit than the upper edge of the first side wall.

6. The light-emitting device according to claim 3, wherein:
- the first light-emitting unit and the second light-emitting unit are adjacent;
- the first side wall faces the second light-emitting unit;
- each of the first side wall and the second side wall comprises an upper edge; and
- the upper edge of the first side wall and the upper edge of the second side wall are aligned.

7. The light-emitting device according to claim 3, wherein the lower semiconductor portion of the first light-emitting unit further comprises a clamped surface between the first side wall and the second side wall, and the clamped surface substantially has a triangular shape with an edge connecting the upper surface.

8. The light-emitting device according to claim 3, further comprising an insulator under the conductive structure.

9. The light-emitting device according to claim 8, wherein the substrate comprises a plurality of patterned structures on the upper surface; and the patterned structures under the insulator and the patterned structures not under the insulator have different sizes and/or different shapes.

10. The light-emitting device according to claim 8, wherein the insulator comprises middle portion on the second side wall and an extending portion on the upper semiconductor portion of the first light-emitting unit, and a width of the middle portion is greater than that of the extending portion.

11. The light-emitting device according to claim 3, wherein in a top view, a length of the second side wall extending on an edge of the first light-emitting unit is equal to a length of the edge.

12. The light-emitting device according to claim 3, wherein the conductive structure comprises a connection electrode on the second side wall and an extending electrode on the upper semiconductor portion of the first light-emitting unit.

13. The light-emitting device according to claim 1, wherein the second sub-side wall is between the first sub-side wall and the substrate, and the second sub-side wall comprises a rugged surface with concaves and convexes.

14. The light-emitting device according to claim 13, wherein the first sub-side wall is even.

15. A light-emitting device, comprising:
- a substrate, comprising an upper surface;
- a first light-emitting unit and a second light-emitting unit, formed on the upper surface, wherein each of the first light-emitting unit and the second light-emitting unit comprises a lower semiconductor portion and an upper semiconductor portion; and
- a conductive structure, electrically connecting the first light-emitting unit and the second light-emitting unit;
- wherein the lower semiconductor portion of the first light-emitting unit comprises a first side wall, adjacent to a periphery of the light-emitting device;
- wherein an included angle between the first side wall and the upper surface is an obtuse angle; and
- wherein in a side view, the first side wall has a parallelogram-like shape or a parallelogram shape with a pair of diagonal angles having a first acute angle and a second acute angle.

16. The light-emitting device of claim 15, wherein the lower semiconductor portion of the first light-emitting unit further comprises a second side wall facing the second light-emitting unit; and an included angle between the second side wall and the upper surface is an acute angle.

17. The light-emitting device of claim 16, wherein the conductive structure is formed on the second side wall.

18. The light-emitting device of claim 15, wherein a difference between the first acute angle and the second acute angle is smaller than 40 degrees.

19. The light-emitting device of claim 15, wherein the lower semiconductor portion of the second light-emitting unit comprises a third side wall adjacent to the periphery of the light-emitting device; wherein an obtuse angle is between the third side wall and the upper surface; and in a side view, the third side wall is a trapezoid.

20. The light-emitting device of claim 15, wherein the first side wall comprises a first sub-side wall and a second sub-side wall connected to the first sub-side wall.

\* \* \* \* \*